United States Patent [19]

Shinbara et al.

[11] Patent Number: 5,485,644

[45] Date of Patent: Jan. 23, 1996

[54] SUBSTRATE TREATING APPARATUS

[75] Inventors: Kaoru Shinbara; Yasuhiro Kurata; Masashi Sawamura, all of Shiga, Japan

[73] Assignee: Dainippon Screen Mfg. Co., Ltd., Japan

[21] Appl. No.: 210,177

[22] Filed: Mar. 17, 1994

[30] Foreign Application Priority Data

| Mar. 18, 1993 | [JP] | Japan | 5-058150 |
| Mar. 18, 1993 | [JP] | Japan | 5-058151 |
| Mar. 18, 1993 | [JP] | Japan | 5-058152 |
| Mar. 18, 1993 | [JP] | Japan | 5-058153 |
| Mar. 18, 1993 | [JP] | Japan | 5-058154 |

[51] Int. Cl.$^6$ .................... H01L 21/304; B08B 11/02; A46B 13/04
[52] U.S. Cl. .................... 15/21.1; 15/88.2; 134/902
[58] Field of Search .................... 15/21.1, 77, 88.1, 15/88.2, 88.3, 88.4, 97.1; 134/61, 62, 66, 198, 902

[56] References Cited

U.S. PATENT DOCUMENTS

| 4,282,825 | 8/1981  | Nagatumo et al. | 134/902 |
| 4,924,890 | 5/1990  | Giles et al.    | 134/61  |
| 4,935,981 | 6/1990  | Ohtani et al.   | 15/88.2 |
| 4,955,402 | 9/1990  | Miranda         | 134/902 |
| 5,092,011 | 3/1992  | Gommori         | 15/88.3 |
| 5,213,118 | 5/1993  | Kamikawa        | 134/902 |
| 5,351,360 | 10/1994 | Suzuki et al.   | 15/88.2 |

FOREIGN PATENT DOCUMENTS

| 2854804   | 6/1979  | Germany | 15/88.3 |
| 0193029   | 11/1984 | Japan   | 15/88.3 |
| 162426    | 6/1992  | Japan.  |         |
| 4-333234  | 11/1992 | Japan.  |         |

Primary Examiner—Edward L. Roberts, Jr.
Attorney, Agent, or Firm—Ostrolenk, Faber, Gerb & Soffen

[57] ABSTRACT

A substrate treatment apparatus includes a loader 1 for soaking a plurality of wafers W in deionized water, a back surface cleaning portion 2, a front surface cleaning portion 3, a rinsing and drying unit 4 and a plurality of transporting units 6. The back surface cleaning unit 2 cleans the back surface of the wafer W with a brush from the lower side by supplying deionized water to the wafer W that is removed from the loader 1. The front surface cleaning unit 3 cleans the upper surface of the wafer W with a brush by supplying deionized water to the wafer W cleaned by the back surface cleaning unit 2. The rinsing and drying unit 4 rinses the cleaned wafer W and then dries it. There is a transporting unit 6 disposed between the loader 1 and the back surface cleaning unit 2, another unit 6 is disposed between unit 2 and the upper surface cleaning unit 3, and another unit 6 is disposed between unit 3 and the rinsing and drying unit 4 while each of these three transporting units 6 transports the wafer W, deionized water is supplied to the wafer W to prevent being dried during the cleaning treatment.

22 Claims, 19 Drawing Sheets

SUBSTRATE TREATING APPARATUS

BACKGROUND OF THE INVENTION

The present invention relates to a substrate treatment apparatus, and more particularly, to a substrate treatment apparatus which treats a substrate using treatment liquid.

A substrate treatment apparatus is disclosed in Japanese Patent Application Laid Open No. 162426/1992, in which substrate treatment such as cleaning is performed on a semiconductor substrate or a plate, such as glass plate for liquid crystal manufacture or photomask use. The apparatus includes a loader carrier on which a cassette vertically storing a number of wafers is set, a transport robot in a loader which removes a substrate from a substrate container on the loader carrier, a rotating brush mechanism for cleaning the front and back surfaces of the substrate simultaneously, and a rotating and drying mechanism which rotates and dries the cleaned wafer.

In the substrate treatment apparatus, the loader transport robot removes the plates one by one from the substrate container that is on the loader carrier. At this time, the substrate container and the substrate are exposed to clean air. Both end surfaces of the substrate that is removed by the transport robot are supported by the rotating brush mechanism and the front and back surfaces are cleaned simultaneously. The cleaned wafer is rotated and dried by the rotating and drying mechanism while opposite edges thereof are supported, and then the dried wafer is put on an unloader carrier.

During handling by the substrate treatment apparatus, the substrate is transported in air that is in a dried state, until a deionized water substrate-cleaning treatment is carried out. More specifically, while the wafer is being transported for the cleaning treatment and while the wafer is waiting for the cleaning treatment, the wafer is in drying contact with air. If the wafer is in contact with the air and dries, it is possible that a natural oxide film will grow superficially on the wafer from oxygen in air, or that air particlulates or chemical agents become fixed to the wafer surfaces.

SUMMARY OF THE INVENTION

It is an object of the present invention to prevent substrate plates from being dried during treatment and transportation.

It is another object of the present invention to prevent substrate plates from being in contact with air between different successive substrate treatments.

A substrate treatment apparatus according to one aspect of the present invention includes a substrate soaking section that soaks a substrate container in treatment liquid, which container holds a plurality of vertically stored plates, a substrate treatment section and a substrate transport section. One or more substrate treatment sections are provided to treat the substrate taken out of the substrate container by supplying the treatment liquid thereto. The substrate transport section is disposed between the substrate soaking section and the substrate treatment section, and transports the plates. The substrate transport section includes treatment liquid supplying means for supplying the treatment liquid to the plates.

In the substrate treatment apparatus, the plates stored in the substrate container are soaked in the treatment liquid by the substrate soaking section. Then, the substrate is taken out of the substrate container and the substrate is transported to the substrate treatment section by the substrate transport section. At this time, the treatment liquid is supplied to the substrate by the treatment liquid supplying means. When the substrate is transported to the substrate treatment section, the substrate is treated in the substrate treatment section with the treatment liquid. There are plurality of substrate treatment sections, and the substrate is transported in a wet state to the next substrate treatment section by the substrate transport section and then treated therein.

In this aspect of the present invention, since the substrate is soaked in the treatment liquid in the substrate soaking section, transported by the substrate transport section while the treatment liquid is supplied, and treated while the treatment liquid is also supplied, the substrate is prevented from being dried.

A substrate treatment apparatus according to another aspect of the present invention includes a substrate treatment section in which the substrate is treated, a substrate transport section and a liquid supplying portion. The substrate transport section is liquid repellent and transports the substrate to the substrate treatment section. The liquid supplying portion supplies liquid or preventing the substrate from being dried, to the surface of the substrate transported by the substrate transport section. In this aspect of the present invention, since the liquid for preventing drying is supplied while the substrate is being transported, the substrate is prevented from being dried and from being in contact with air.

These and other objects and advantages of the present invention will be more fully apparent from the following detailed description of the accompanying drawings.

DESCRIPTION OF THE PREFERRED EMBODIMENT

Figure 1:
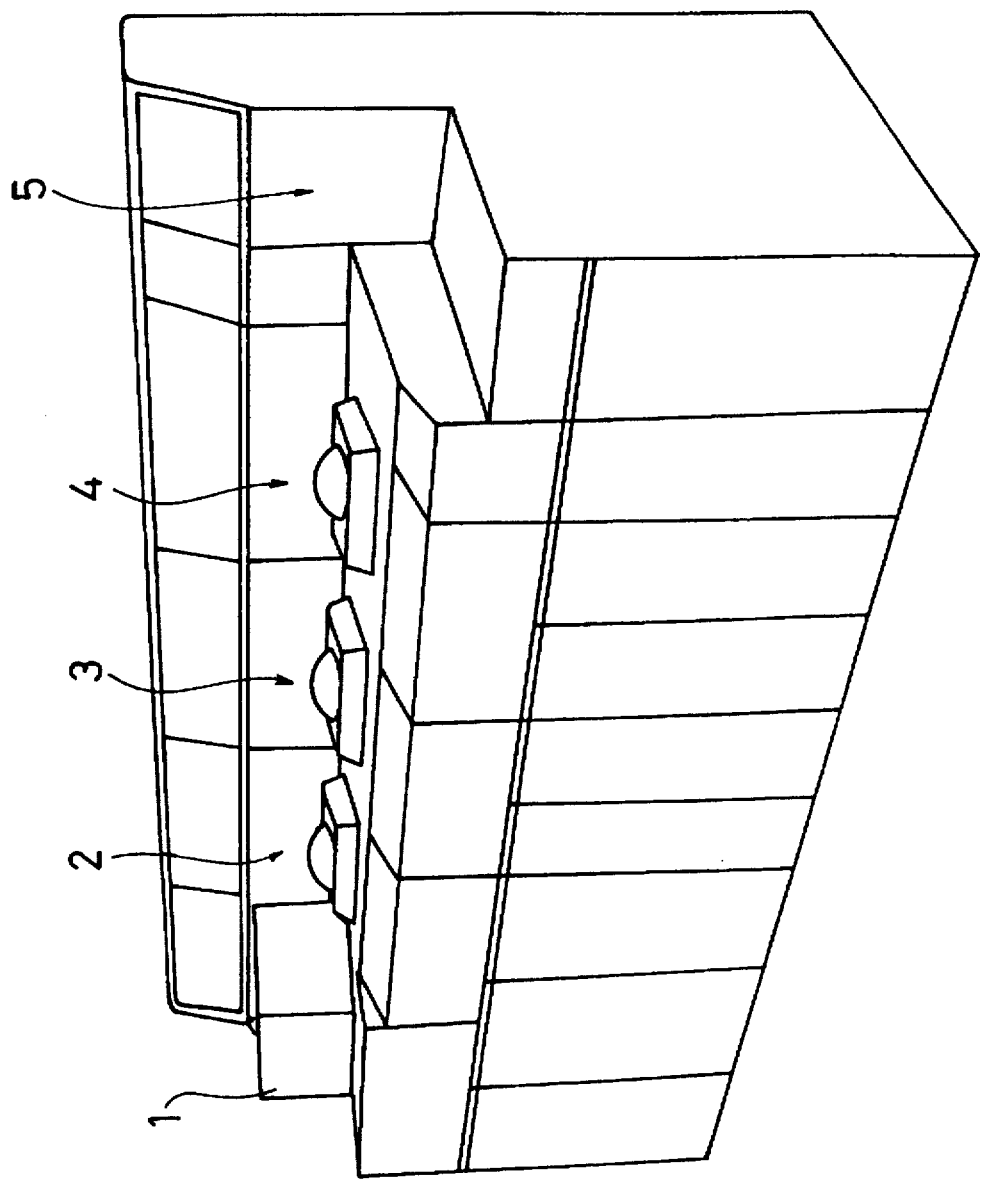
FIG. 1 is a perspective of a substrate treatment apparatus constructed according to an embodiment of the present invention.

The substrate treatment apparatus constructed according to a first embodiment of the present invention (FIGS. 1 and 2) cleans and dries a semiconductor wafer W (an example of a substrate). Proceeding from left to right in FIGS. 1 and 2, it is seen that the substrate treatment apparatus comprises a loader 1 for soaking many wafers W stored in a cassette C (an example of a substrate container) in deionized water, a unit 2 cleaning with a brush for cleaning a back surface (lower surface) of the wafer W, a cleaning unit 3 with a brush for cleaning a front surface (upper surface) of the wafer W, a rinsing and drying unit 4 for rinsing the wafer W in water and drying it, and unloader 5 for taking the treated wafers W into another cassette C and unloading them.

Transport units 6, each comprising a multi-joint robot 7 are disposed between loader 1, units 2 to 4 and unloader 5. The transport unit 6, the loader 1, the units 2 to 4, and the unloader 5 are each isolated by a shutter (not shown). Deionized water is supplied into the loader 1 and the units 2 to 4 and 6 from a deionized water supplying unit 8 through a control valve 9. The water from the loader 1 and units 2 to 4 and 6 is drained by a drainage collecting unit 10.

The loader 1 includes a tank 11 (FIG. 3) containing deionized water into which the cassette C is soaked, and a lifting unit 12 vertically moving the cassette C in the tank 11. The lifting unit 12 is vertically movable between a position in which the uppermost wafer W in the cassette C is completely soaked in the deionized water and a position in which the lowermost wafer W in the cassette C is higher than the surface of the deionized water. The cassette C is hollow and an opening 13 through which the wafers W are taken in and out is formed on the right side of the cassette C in FIG. 3.

Figure 4:
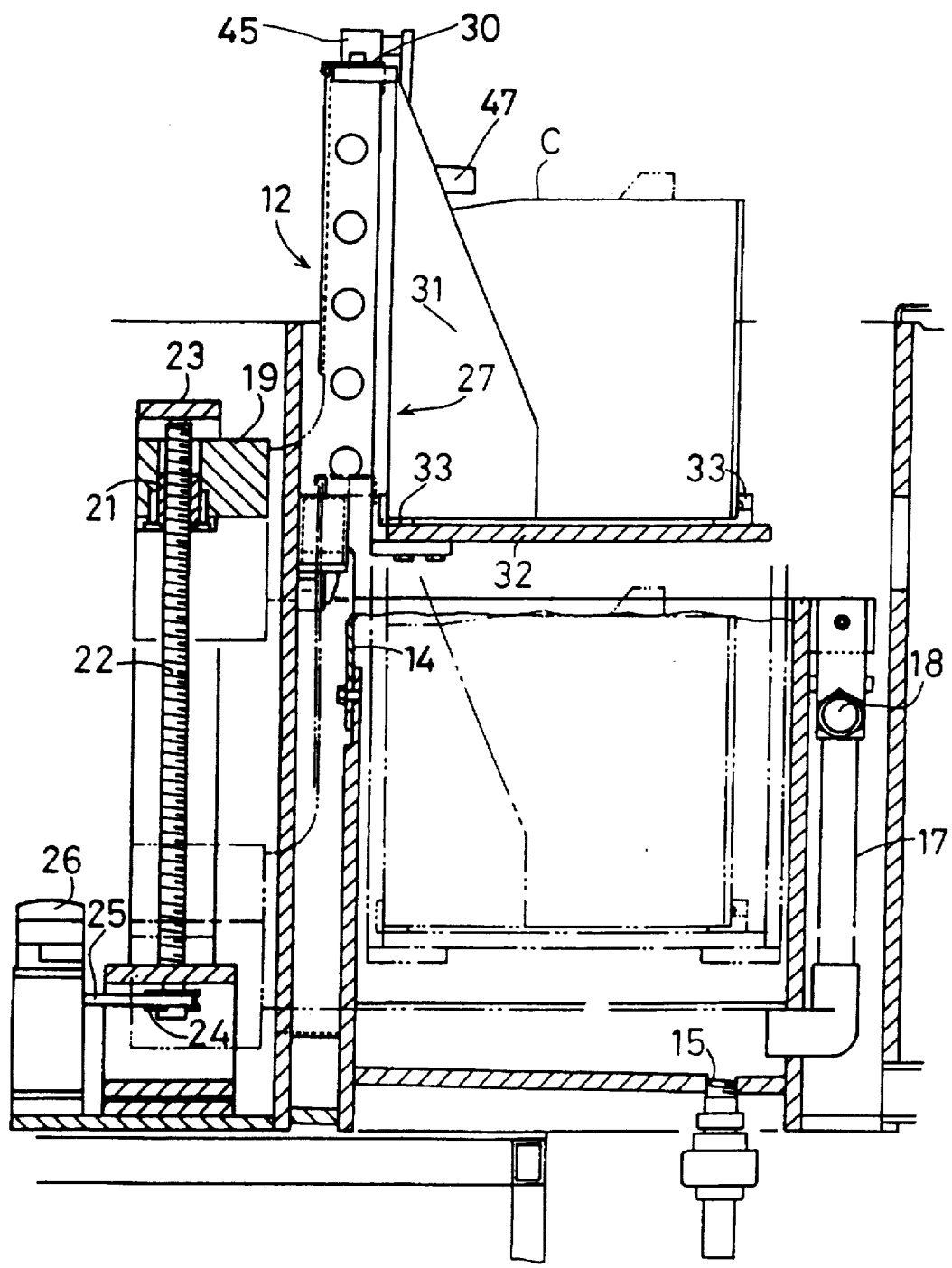
FIG. 4 is a vertical section of the loader.
Figure 4A:
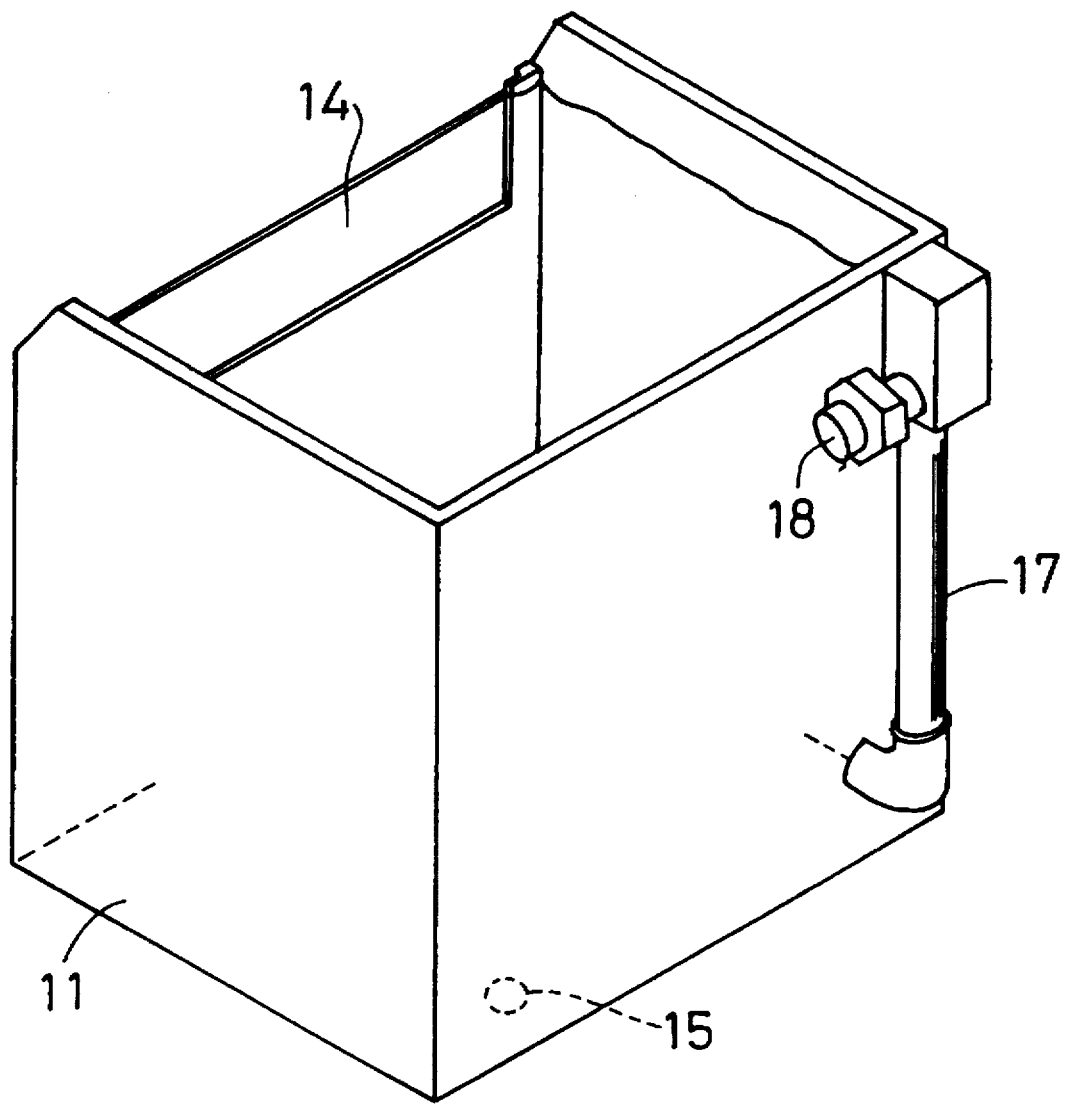
FIG. 4A is a perspective of a tank.
Figure 5:
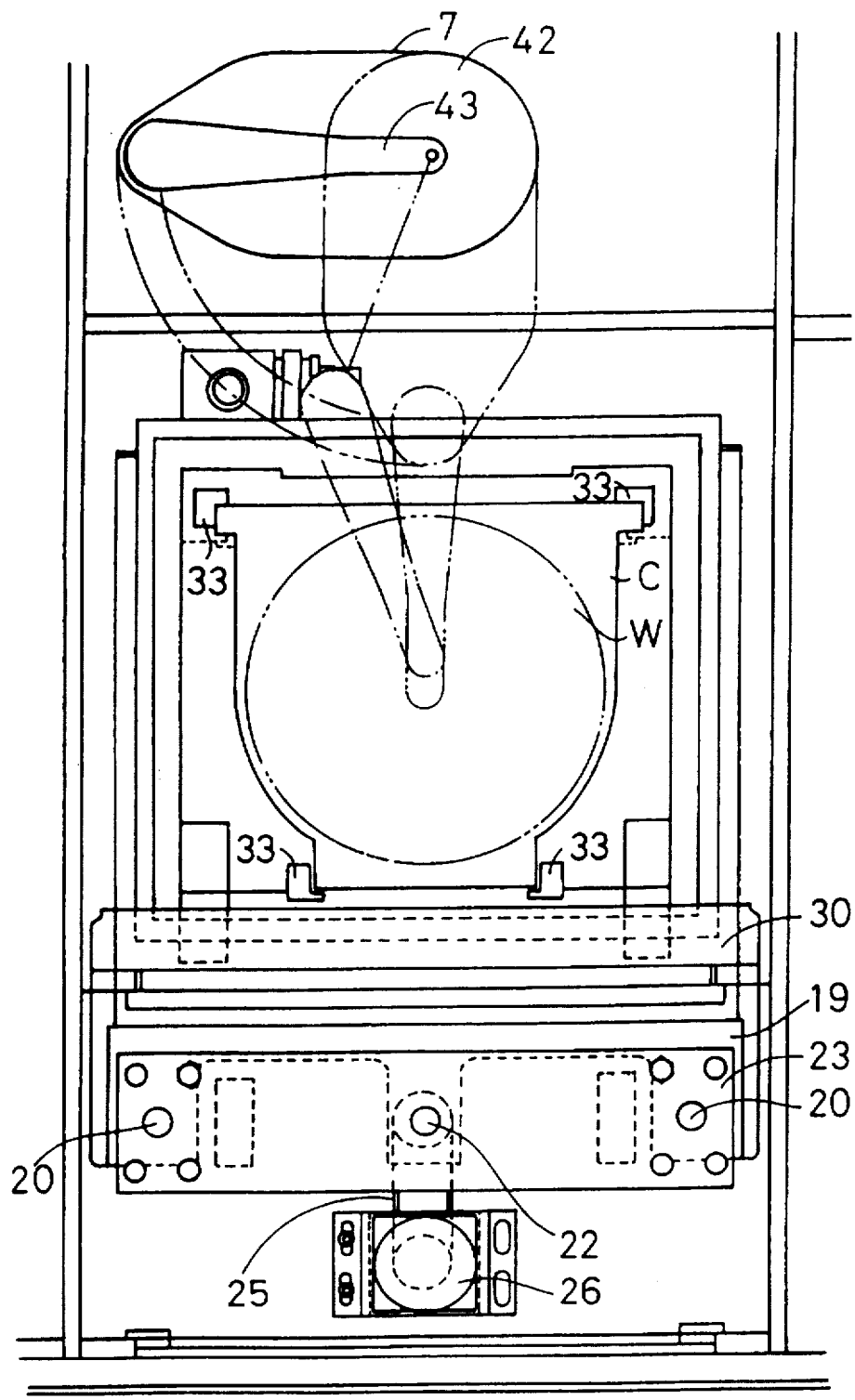
FIG. 5 is a plan view of the a loader.

The tank 11 is formed of a synthetic resin, and a weir 14 which can adjust a vertical position is provided on the left side of the cassette C in FIG. 4 (which is opposite the opening 13). The weir 14 establishes a height for the water surface in the tank 11. A deionized water supplier or inlet 15 is formed near the opening 13 of the cassette C, at the bottom of the tank 11. The deionized water is supplied from the supplier 15 to the tank 11, and overflows from the weir 14. Therefore, while the deionized water is supplied, a water current is formed from the opening 13 of the cassette C toward the rear side of the tank at least in the vicinity of the surface of the water in the tank 11. A level gauge 17 using all electrostatic capacity sensor 18 is disposed on one side of the tank 11.

The lifting unit 12 comprises a lifting frame 19 that is supported on two vertical guide shafts 20, such that the lifting frame 19 is vertically movable. A ball nut 21 is disposed in the center of the lifting frame 19 and is engaged with a vertical ball screw 22 which vertically extends. The ball screw 22 is rotatably mounted to a guide frame 23 which supports the guide shafts 20. The ball screw 22 is rotatably driven by a motor 26 through a toothed pulley 24 and a toothed belt 25 disposed at the lower end. Thus, the lifting frame 19 is vertically movable.

A pair of lifting members 27 formed of a stainless steel sheet and a vertical member 31 connected thereto are disposed at both ends of the lifting frame 19. A cassette base 32 formed of synthetic resin plate is mounted onto the lower end of each vertical member 31. A positioning member 33 for positioning four corners of the cassette C is mounted to the cassette base 32.

The upper ends of the lifting members 27 are connected by a connecting member 30. A member 44 for preventing the cassette C from rising when the cassette C is lowered into the tank 11 is provided in the center of the connecting member 30. The member 44 includes a bearing 45 fixed to the connecting member 30 and a stopper 47 rotatably connected to the bearing 45 through a shaft 46.

Figure 2:
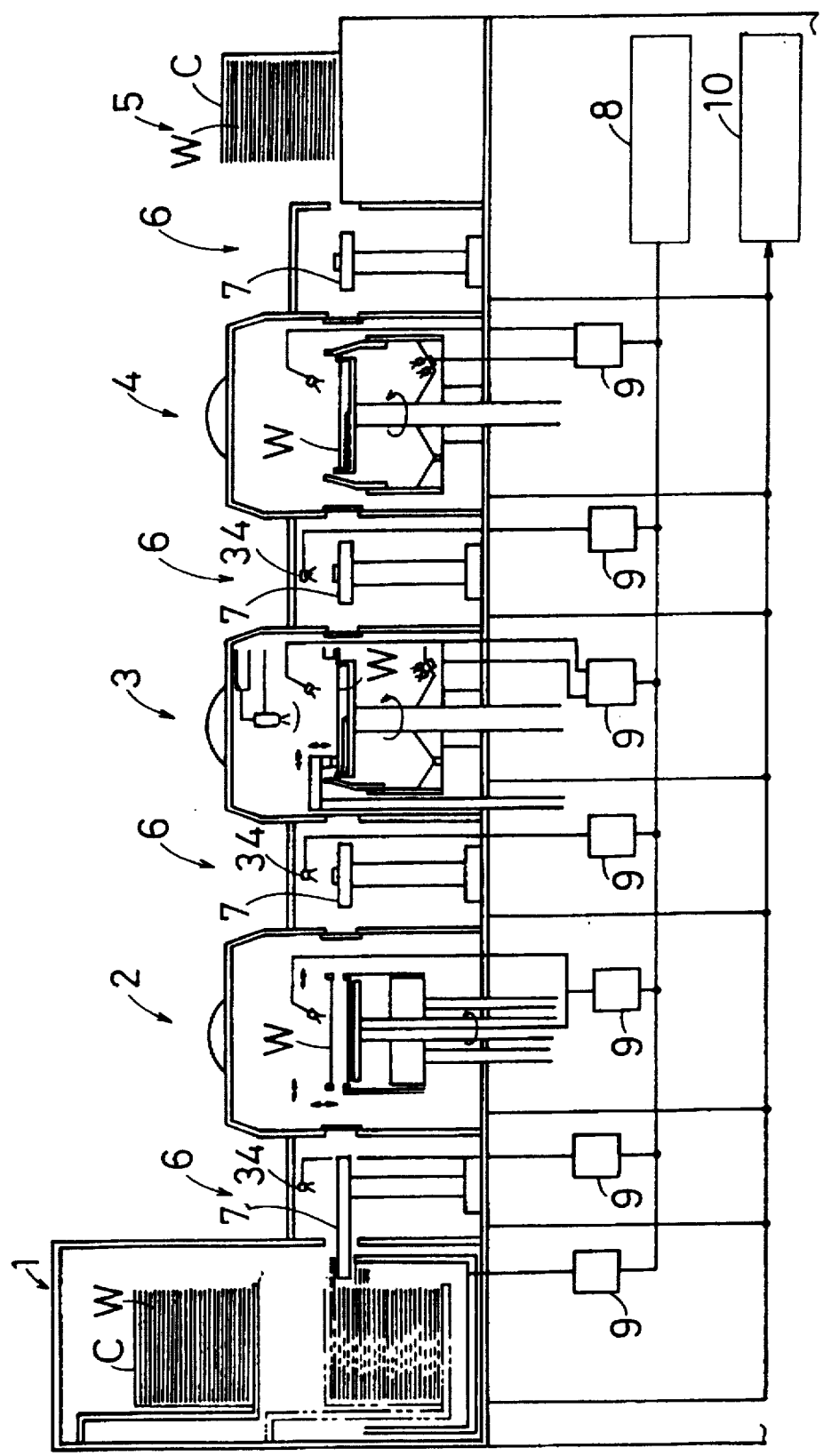
FIG. 2 is a longitudinal vertical section in schematic form of the apparatus of FIG. 1.
Figure 6:
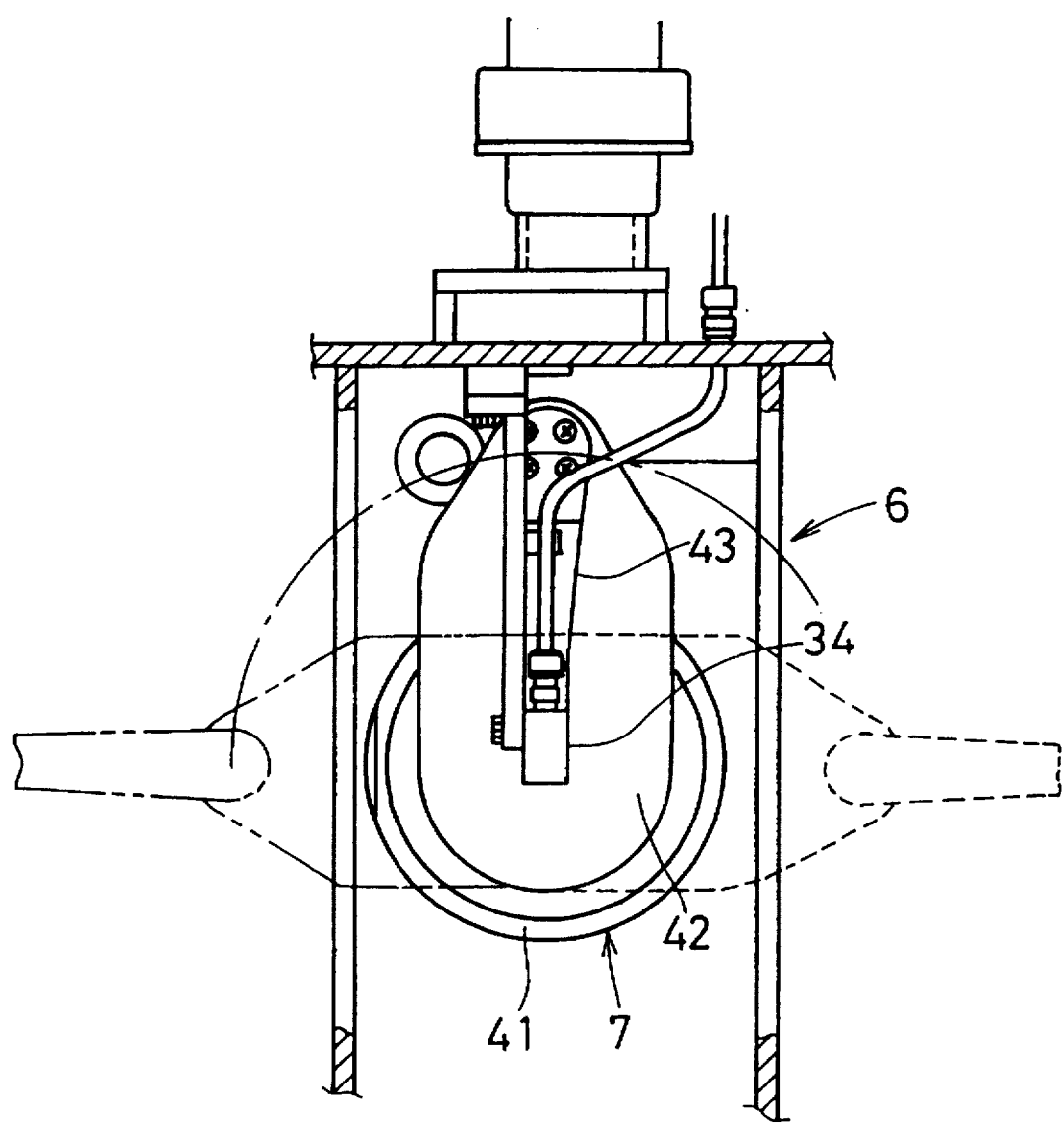
FIG. 6 is a plan view of a transport unit.
Figure 7:
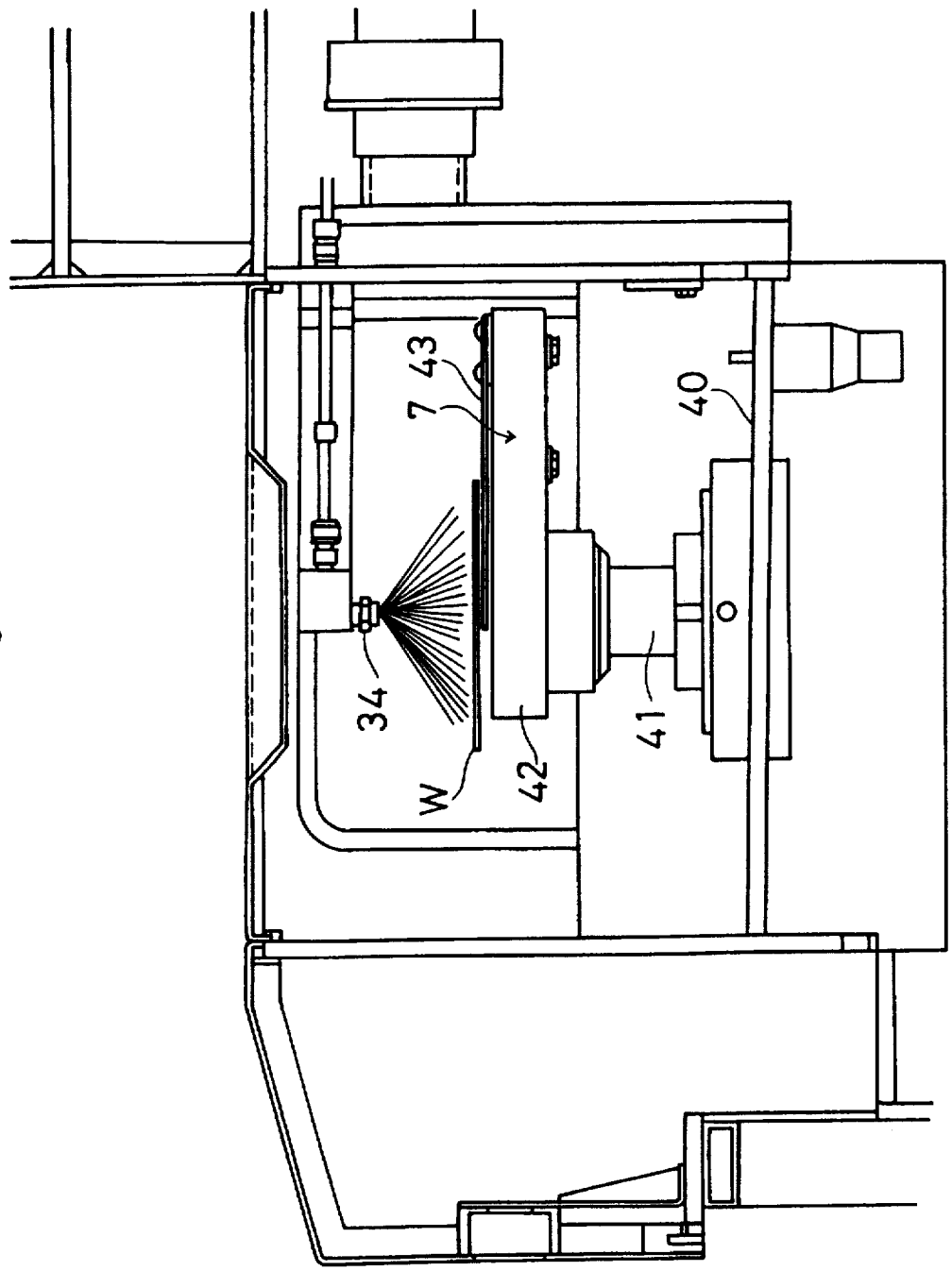
FIG. 7 is a side view of the transport unit.

For all but the right most transport unit 6 shown in FIG. 2, an injection nozzle 34 for injecting deionized water is provided at the upper portion of each of three multi-joint robots 7 on the wafer-transporting side as shown in FIGS. 6 and 7. The injection nozzle 34 injects deionized water to the wafer W engaged by the multi-joint robot 7 to prevent the wafer W from being dried and from being in contact with air. The nozzle 34 injects deionized water in the form of a cone having a diameter a little larger than that of the wafer W.

The multi-joint robot 7 includes a vertical column 41 mounted to the frame 40 of the substrate treatment apparatus, a horizontal base 42 rotatably supported on vertical column 41, and a horizontal transport arm 43 rotatably supported at an end of the base 42. As shown in FIG. 6, the multi-joint robot 7 is movable between a waiting position shown by a solid line, a carrying-out position shown by a two-dotted line, and a carrying-in position shown by a dotted line. In the waiting position, the transport arm 43 is on the base 42. In the carrying-out position, the base 42 is turned counterclockwise by 90° in FIG. 6, and the base 42 and the transport arm 43 are aligned in a straight line. The carrying-in position is a line symmetry of the carrying-out position about the waiting position.

Figure 8:
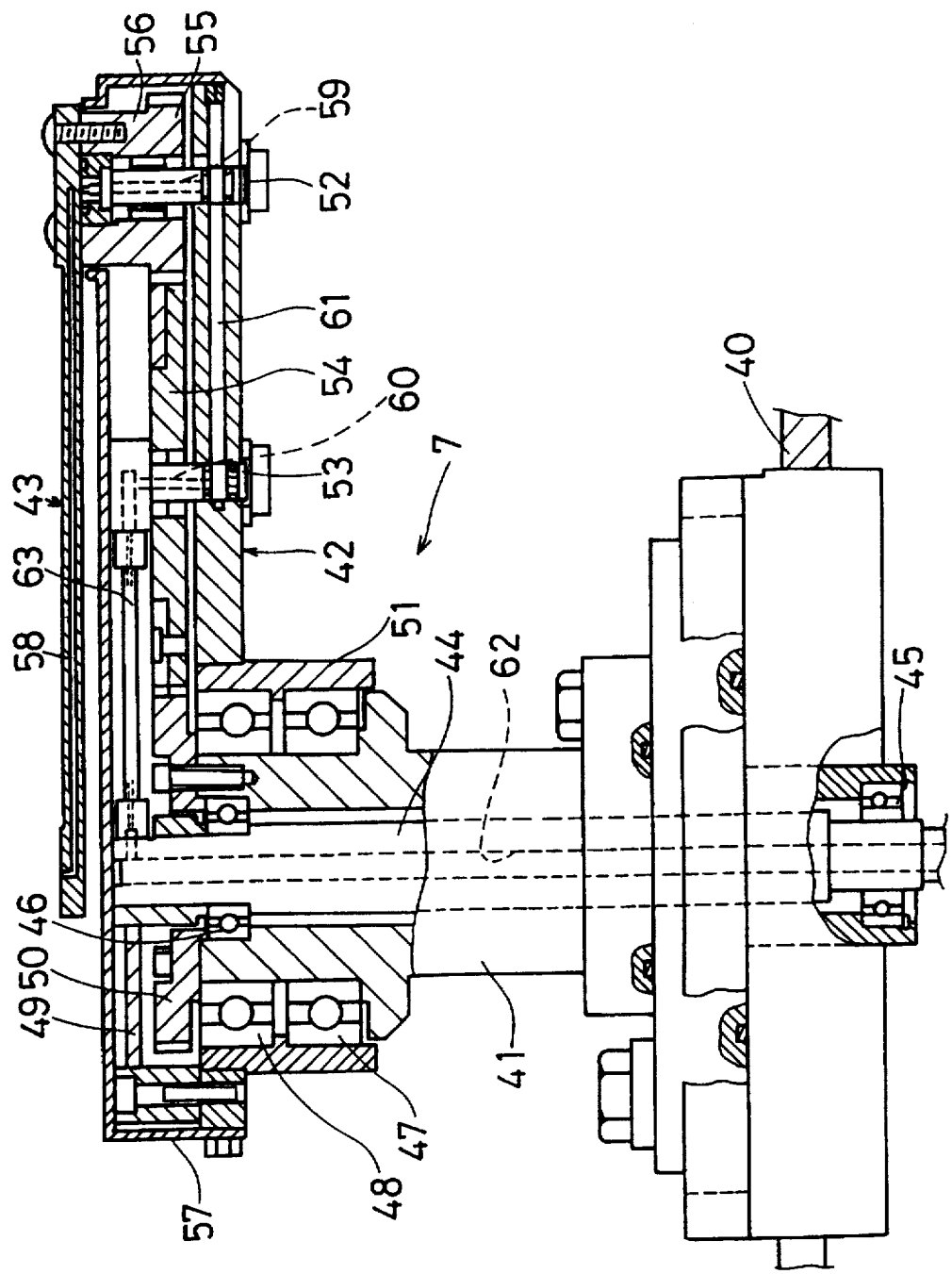
FIG. 8 is a partially sectioned side view showing a multi-joint robot.

The vertical column 41 is formed of a stainless steel and almost cylindrical as shown in FIG. 8. A shaft 44 rotatably supported to bearings 45 and the 46 formed of a stainless steel is disposed inside the vertical column 41. A rotation lever 49 formed of a synthetic resin is fixed to the upper end of the shaft 44. A rotation driving mechanism comprising a motor (not shown) is connected to the lower end thereof. The rotation lever 49 is fan-shaped as shown in FIG..9 and its outer periphery is fixed to the base 42. Therefore, the base 42 and the rotation shaft 44 are integrally rotated.

A spur gear 50 formed of a synthetic resin is fixed to the upper end of the vertical column 41. Therefore, the spur gear 50 is integrally rotated with the vertical column 41. Bearings 47 and 48 formed of a stainless steel are disposed at the upper end of the outer periphery of the column 41. The bearings 47 and 48 rotatably support the base 42.

The base 42 is formed of aluminum and coated with a 4-ethylene fluoride. The base 42 is substantially elliptical and includes a bearing container 51 containing the bearings 47 and 48 at the bottom portion. Fixing shafts 52 and 53 formed of synthetic resin are disposed respectively toward one end of, and central of, the base 42. A middle gear 54 formed of a synthetic resin which is engaged with the spur gear 50 is rotatably supported to the fixing shaft 53. The middle gear 54 is a double-tiered gear and self-adjusts to prevent backlash. A pinion 55 formed of a synthetic resin is rotatably supported to the end of the fixing shaft 52. The pinion 55 includes a boss 56 at its upper portion and a bottom end of the transport arm 43 is fixed to the upper end of the boss 56.

The rotation lever 49, the spur gear 50, the middle gear 54 and the pinion 55 are covered with a cover 57 formed of a synthetic resin screwed around the base 42.

The transport arm 43 is formed of a stainless steel sheet and a suction passage 58 having an opening at the upper surface of the end of the transport arm 43 and extending toward the fixing shaft 52 is formed inside the arm. Additionally, suction passages 59 and 60 are formed in the center of the fixing shafts 52 and 53, respectively. A suction passage 61 communicating with suction passages 59 and 60 is also formed in the base 42. In addition, an suction passage 62 is formed in the center of the rotation shaft 44. The passages 62 and 60 are connected by a suction conduit 63.

Figure 10:
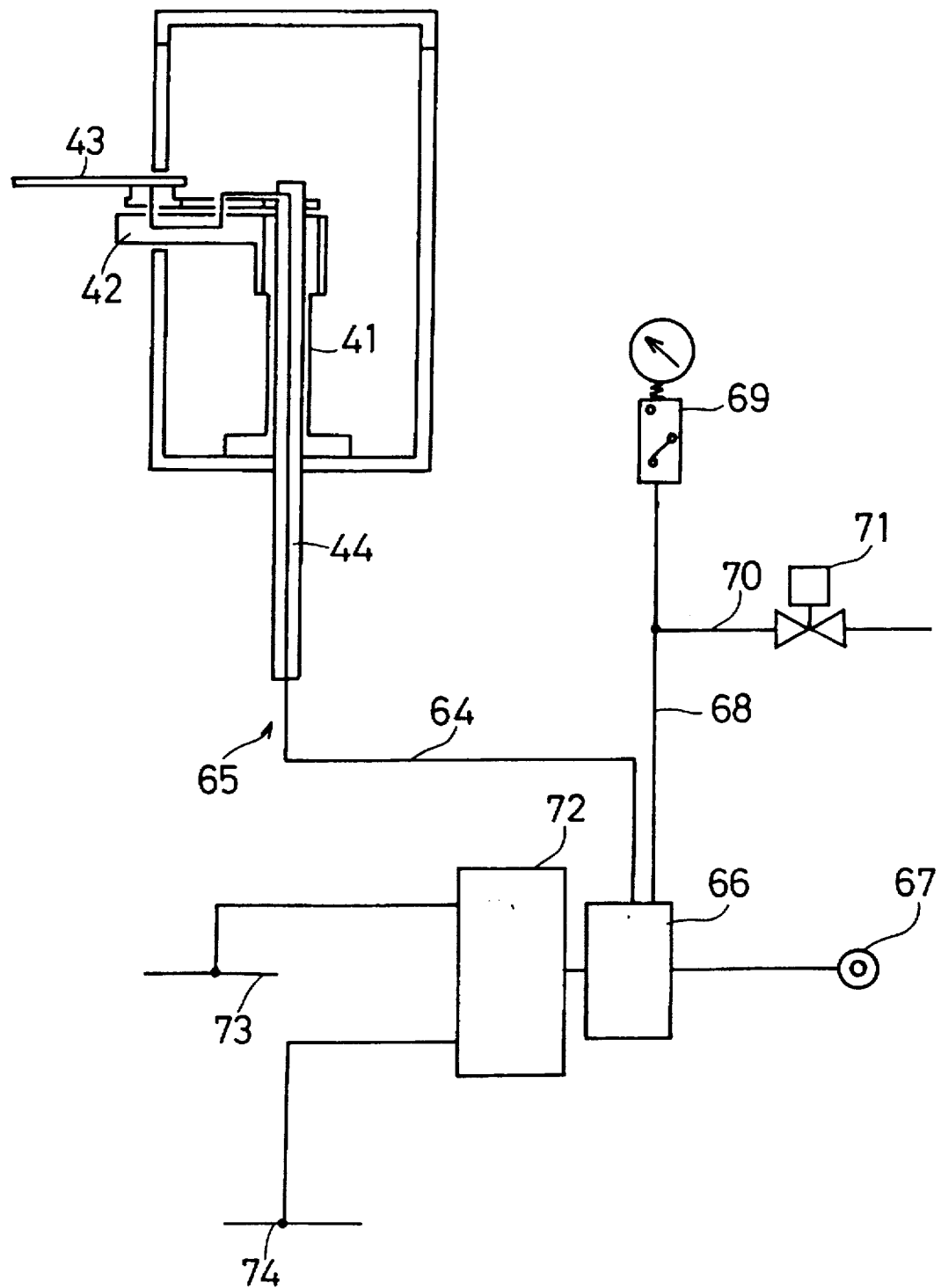
FIG. 10 is a conduit diagram for the multi-joint robot.

As shown in FIG. 10, one end of a negative pressure conduit 64 is connected to a bottom end of the rotation shaft 44. A suction path 65 consists of the suction passages 58 to 62, the suction conduit 63 and the negative pressure conduit 64. The other end of the negative pressure conduit 64 is connected to a negative pressure generator 66.

The negative pressure generator 66 is an aspirator system which generates a negative pressure by high-pressure air from an air source 67 connected to the negative pressure generator 66. A vacuum gauge 69 having a low-end cutoff point is connected through an instrument conduit 68 to the negative pressure generator 66. An open conduit 70 opened to air is connected to the instrument conduit 68 in the vicinity of the vacuum gauge 69. An on-off valve 71 of an electromagnetic control system is disposed in the open conduit 70. The open conduit 70 removes the deionized water entering from the suction path 65 into the instrument conduit 68.

A steam separator 72 is connected to the negative pressure generator 66 on the left side in FIG. 10. The steam separator 72 separates water from air in air. An exhaust tube 73 and a waste pipe 74 are connected to the steam separator 72 downstream thereof.

When the wet wafer W is adsorbed by an end of the transport arm 43, water enters into the suction path 65. The water flows from the negative pressure generator 66 to the steam separator 72. The air separated by the steam separator 72 is discharged to the exhaust tube 73, and the water separated thereby is drained to the waste pipe 74. In addition, some water enters into the instrument conduit 68. When the deionized water stays in the instrument conduit 68, since measurement becomes impossible in the vacuum gauge 69, the on-off valve 71 is opened just before the measurement by the vacuum gauge 69 and the instrument conduit 68 is opened to air to discharge the deionized water in the instrument conduit 68 toward the negative pressure generator 66.

Figure 11:
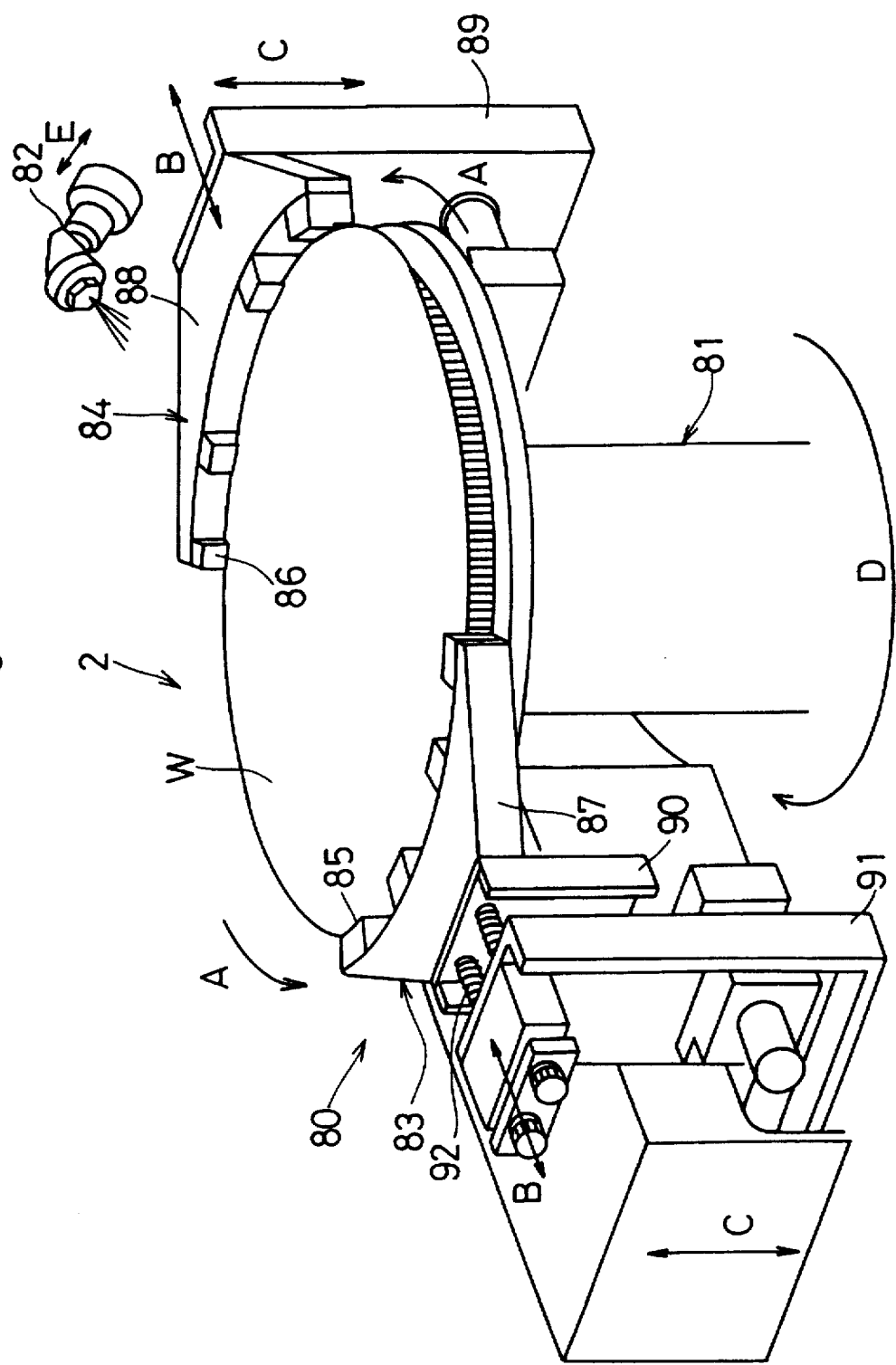
FIG. 11 is a perspective showing part of a back surface cleaning unit.

Referring to FIG. 11, the back surface cleaning unit 2 includes a wafer holding mechanism 80 for holding and rocking the wafer W, a cleaning mechanism 81 for cleaning the back surface of the wafer W with a brush, and a front surface cleaning nozzle 82 injecting deionized water to the front surface of the wafer W.

The wafer holding mechanism 80, which includes a pair of oppositely disposed holding portions 83 and 84, creates planetary swiveling in the direction shown by arrow A without rotating the wafer W on its own axis.

The holding portions 83 and 84 includes holding claws 85 and 86 disposed in spaced relationship along the outer periphery of the wafer W, and holding arms 87 and 88 supporting the respective holding claws 85 and 86. The holding arm 88 on the right rear side of FIG. 11 is fixed to an upper end of a holding bracket 89. The holding arm 87 on the left front side of FIG. 11 is fixed to the upper end of a pressing bracket 90 that is detachably supported to the holding bracket 91 that is disposed on the left front side of FIG. 11. The pressing bracket 90 is constantly impelled (biased) by a spring 92 in the direction pressing the wafer W.

Figure 12:
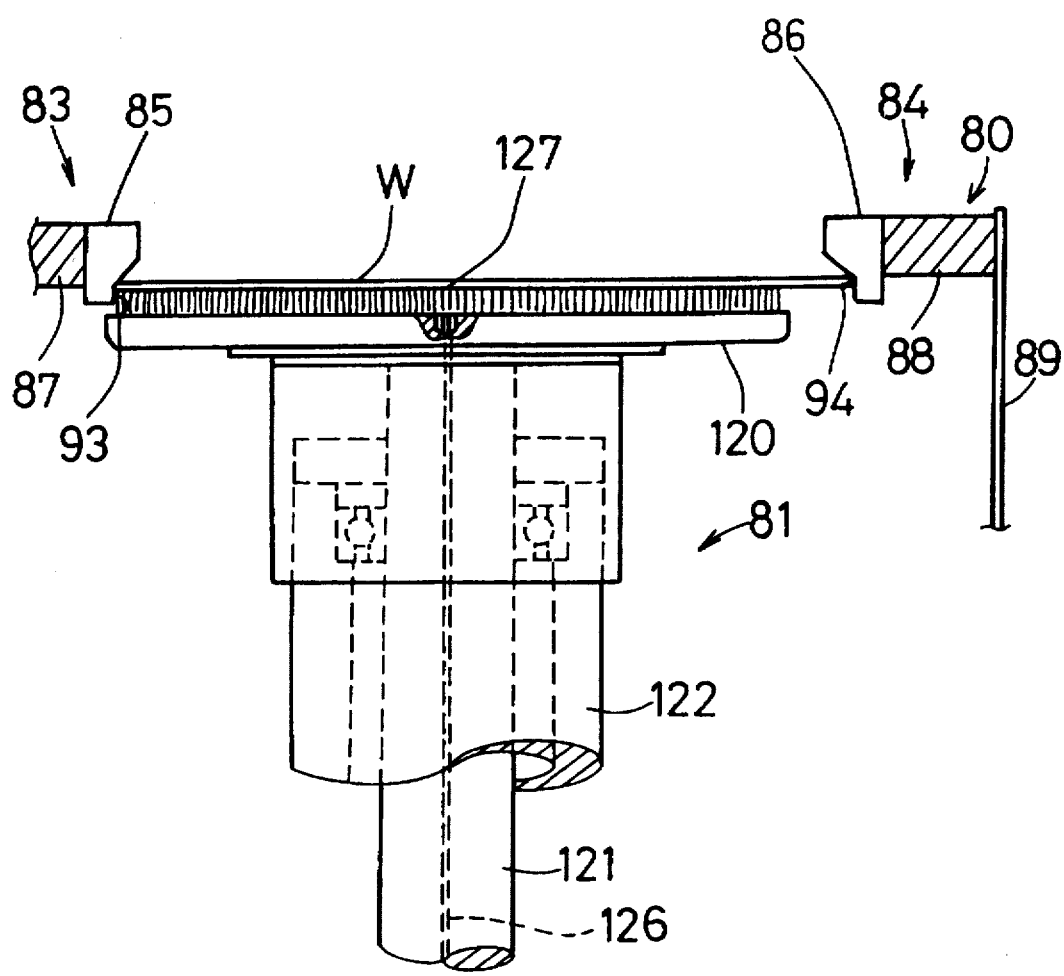
FIG. 12 is a vertical section through part of the back surface cleaning unit.

As shown in FIG. 12, the lower portions of holding claws 85 and 86 include abutment surfaces 93 and 94, respectively. The abutment surfaces 93 and 94 hold the wafer W by elastic force of the spring 92. The holding claws 85 and 86 are gradually thickened horizontally from the abutment surfaces 93 and 94 toward the upper portions. The abutment surfaces 93 and 94 form a part of the same cylindrical surface about the center of the wafer W and abut on the outer rim of the wafer W. Therefore, when the holding claws 85 and 85 hold the wafer W, the whole back surface of the wafer W is exposed to the lower portion.

Figure 13:
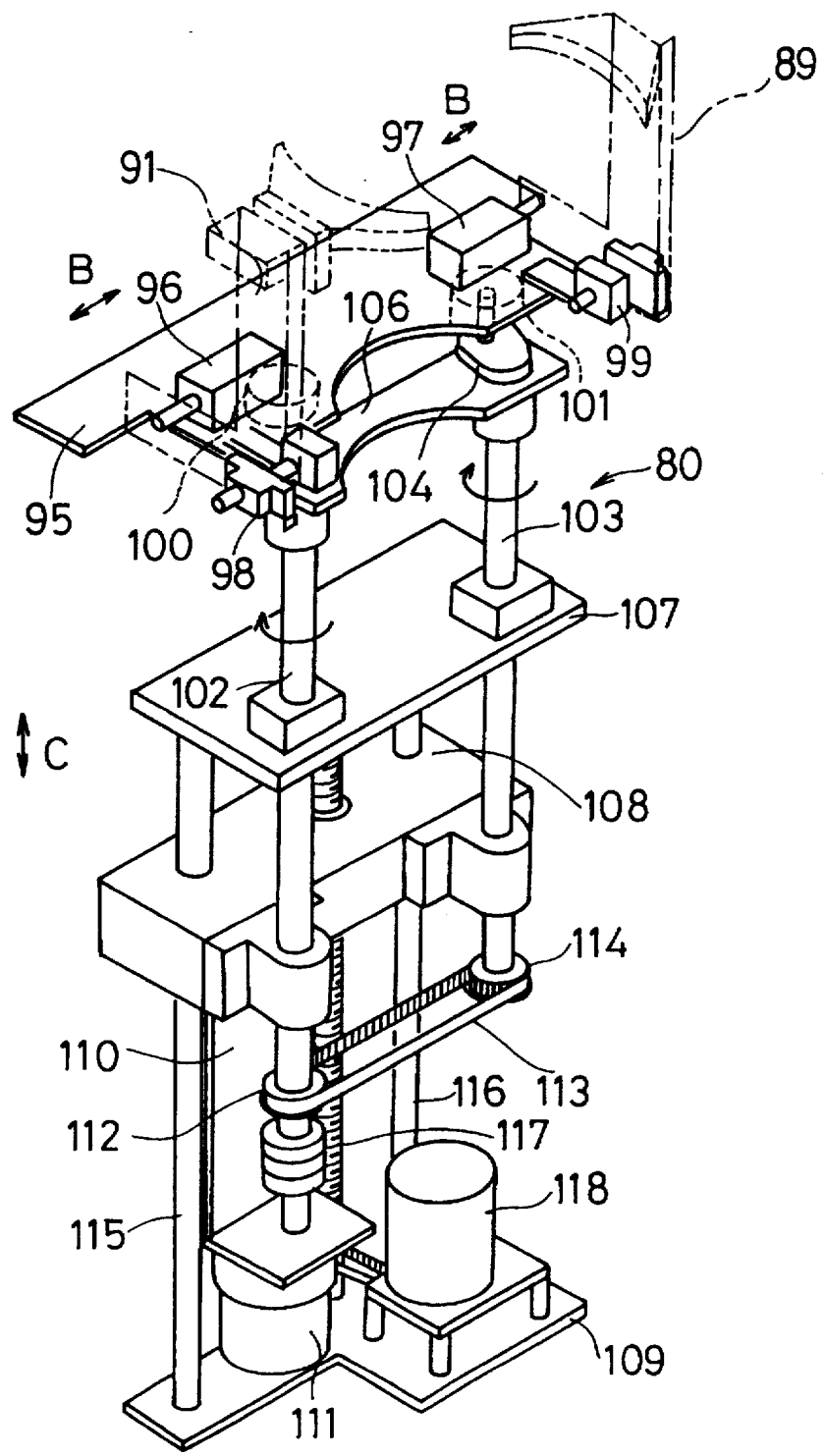
FIG. 13 is a perspective of a wafer holding mechanism.

Referring to FIG. 13, each of the holding brackets 89 and 91 is an L-shaped plate and its lower portions are detachably secured to a rocking frame 95 for movement in directions shown by an arrow B. Two air cylinders 97 and 96 for operating the holding brackets 89 and 91 toward and away from each other are fixed on both sides of the rocking frame 95. In addition, guides 99 and 98 detachably supporting the holding frames 89 and 91 are provided on both front sides of the rocking frame 95.

Spaced bearings 100 and 101 are disposed on the back surface of the rocking frame 95. The ends of rockshafts 102 and 103 each having an eccentric cam 104 (only one being shown in FIG. 13) at the upper portions are rotatably supported by bearings 100 and 101, respectively. When the rockshafts 102 and 103 rotate, the rocking frame 95 rocks eccentrically, being driven in the direction indicated by arrow B by the eccentric cam 104. Thus, the wafer W held by the holding claws 85 and 86 rocks.

The rockshafts 102 and 103 are rotatably supported by an upper lifting frame 106 disposed under the eccentric cam 104 and a lower lifting frame 108 disposed under fixing frame 107. In addition, rock shafts 102 and 103 are supported on an upper fixing frame 107 disposed between the upper lifting frame 106 and the lower lifting frame 108 so as to be rotatable and vertically movable.

A rocking motor 111, fixed to a bracket 110 extending downward from the lower lifting frame 108, is connected to the lower end of the rockshaft 102 on the left front side of FIG. 13. The driving force of the motor 111 is transmitted to the other rockshaft 103 through a pulley 112, a timing belt 113 and a pulley 114 disposed between the lower lifting frame 108 and the motor 111. Therefore, the rockshafts 102 and 103 rotate synchronously rotate in the same direction.

The upper fixing frame 107 and the lower fixing frame 109 are connected by guide shafts 115 and 116. The lower lifting frame 108 is supported by the guide shafts 115 and 116 so as to be vertically movable. A screw shaft 117, disposed between the upper guide shafts 115 and 116, is rotatably supported by the upper fixing frame 107 and the lower fixing frame 109. The screw shaft 117 is engaged with a female thread (not shown) provided in the lower lifting frame 108 and is rotated by a lifting motor 118 fixed to the lower fixing frame 109 so that lower lifting frame 108 is driven vertically by the rotation of the motor 118.

Thus, the wafer W can be moved up and down in the direction shown by an arrow C in FIG. 13.

Figure 14:
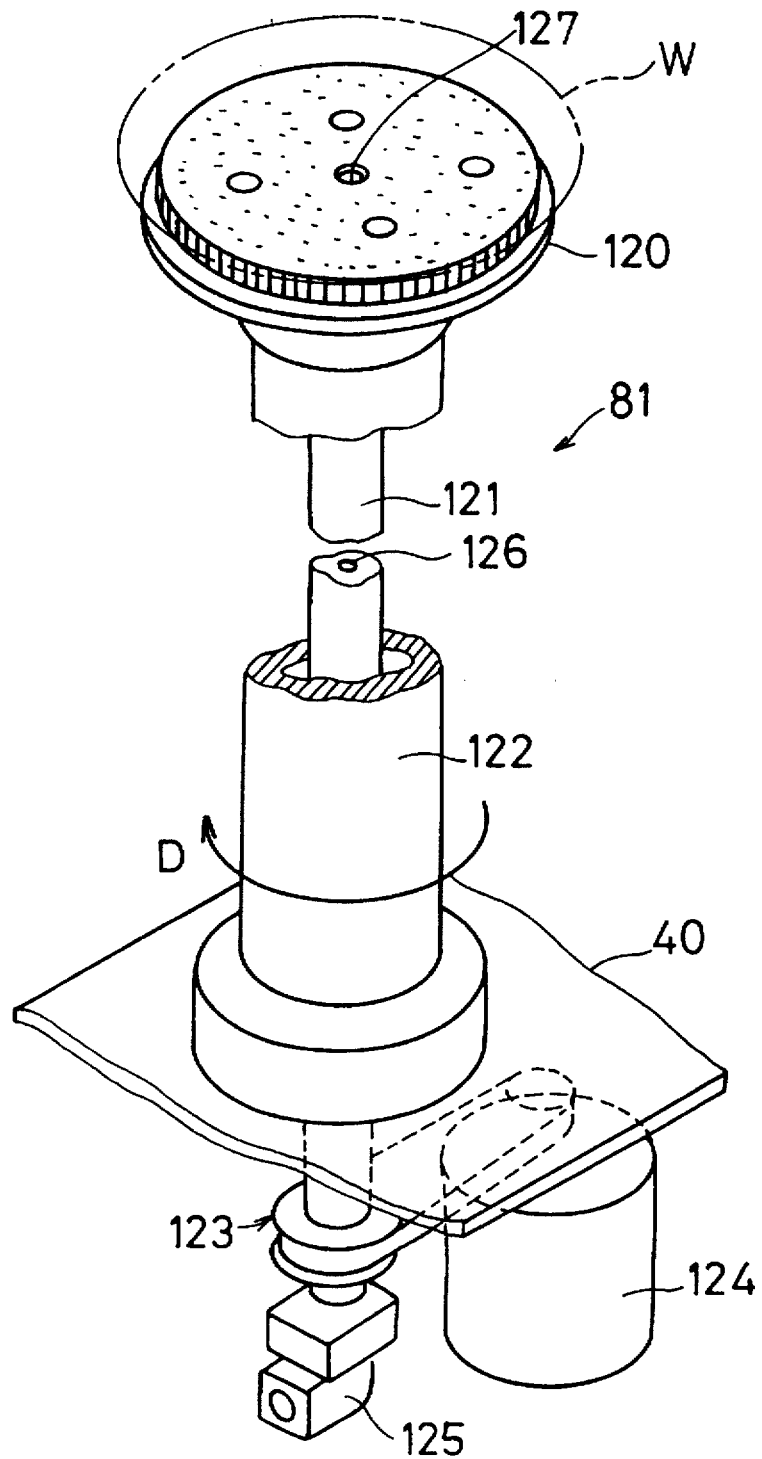
FIG. 14 is a partially sectioned perspective of the a brush rotating mechanism.

Referring to FIG. 14, the brush rotation mechanism 81 comprises a circular brush 120 that is fixed to the upper end of a rotation shaft 121. The rotation shaft 121 is rotatably supported by a cylinder 122 disposed concentric with the rotation shaft 121. The lower end of the cylinder 122 is fixed to an apparatus frame 40. The driving force of the motor 124 is transmitted to the rotation shaft 121 through a transmission mechanism 123 comprising a pulley and a timing belt. Thus, the circular brush 120 is rotated relative to and while in contact with the wafer W, in the direction shown by an arrow D.

A rotatable joint 125 is mounted to the lower end of the rotation shaft 121. The rotatable joint 125 is connected to a hollow 126 formed in the rotation shaft 121 over the whole length of the shaft.

The circular brush 120 comprises many nylon fibers and a deionized water supplying nozzle 127 connected to the upper end of the hollow 126 is disposed in the center of the brush. When the deionized water is discharged from the nozzle 127 at the time of cleaning, the discharged deionized water flows toward the outer periphery of the circular brush 120 by centrifugal force. Thus, particles removed by the circular brush 120 are effectively cleared away from wafer W. In addition, when the deionized water is discharged from the nozzle 127 during waiting periods, the discharged deionized water flows toward the outer periphery of the circular brush 120 by centrifugal force. Thus, particles attached to the circular brush 120 removed and also the circular brush 120 is prevented from drying during the waiting period.

Figure 15:
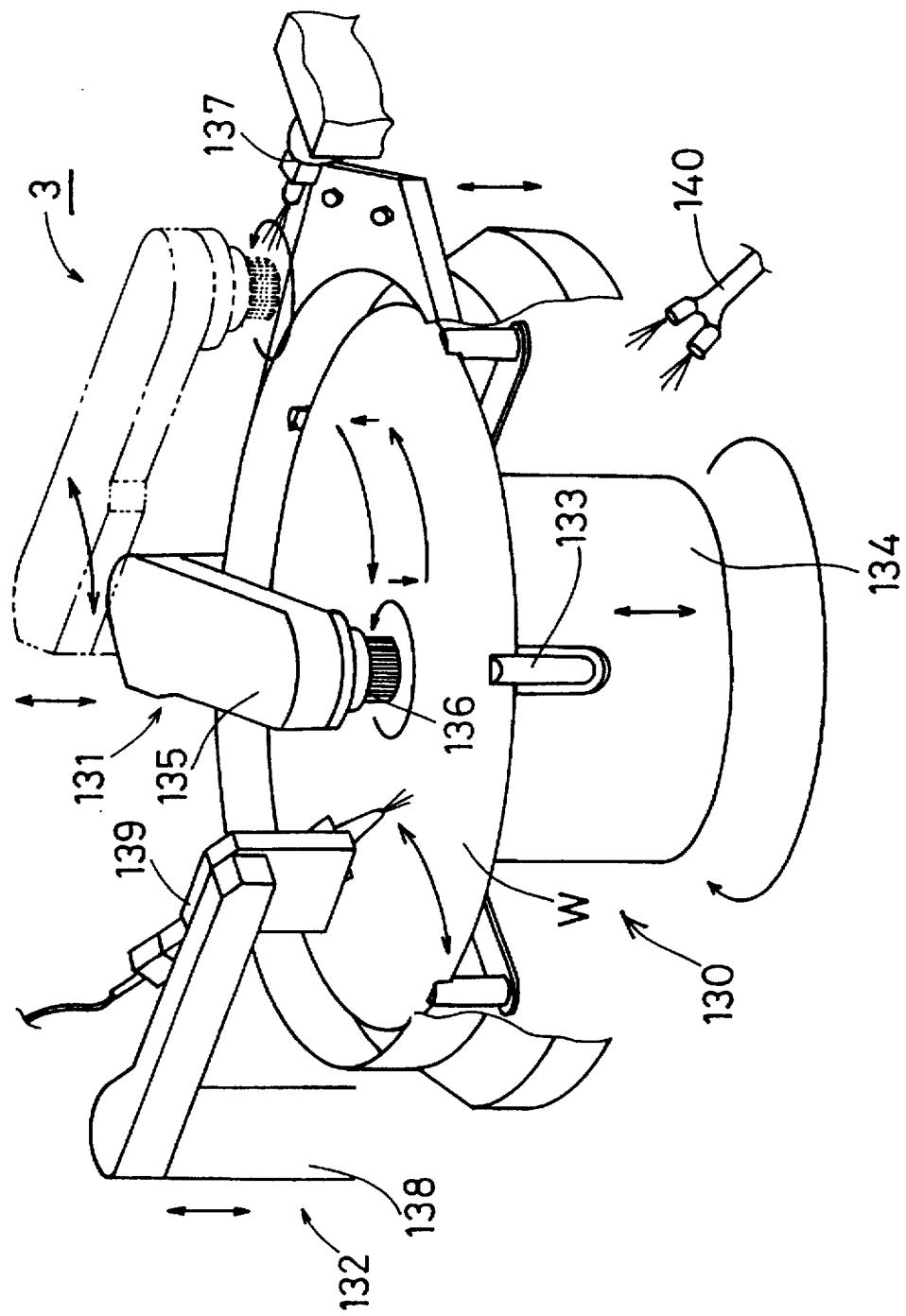
FIG. 15 is a perspective showing part of a front surface cleaning unit.

Referring to FIG. 15, the front surface cleaning apparatus 3 includes a wafer lifting and rotating mechanism 130 which lifts and rotates the wafer W while holding it, a cleaning mechanism 131 for cleaning the front surface of the wafer W while in contact with the front surface of the wafer W, and a deionized water injecting mechanism 132 injecting deionized water onto the surface of the wafer W.

The wafer lifting and rotating mechanism 130 includes a plurality of holding claws 133 holding a side surface of the wafer W. The holding claws 133 are lifted and rotated by a wafer lifting and rotating portion 134.

The cleaning mechanism 131 includes an arm 135. The end of the arm 135 rocks toward the outer periphery from the center of the wafer W. A circular brush 136 is rotatably disposed at the end of the arm 135. When the arm 135 is disposed at the waiting position shown by a two-dotted line in the FIG. 15, a cleaning nozzle 137 for cleaning the circular brush 136 is disposed at a position opposite the circular brush 136. Particles that become attached to the circular brush 136 aloe removed by the cleaning nozzle 137.

The deionized water injecting mechanism 132 includes a nozzle supporting arm 138 which lifts up and down and rocks. An ultrasonic nozzle 139 injecting deionized water oscillated by ultrasonic wave is disposed at the end of the nozzle supporting arm 138 so as to be able to inject the deionized water downward toward the center of the wafer W at an angle. The angle is adjustable.

A back surface cleaning nozzle 140 for removing particles coming that comes from the front or upper surface of water W to the back (or lower) surface at the time of cleaning, is disposed under the wafer W. The cleaning nozzle 140 injects deionized water toward the back surface of the wafer W in two directions.

Figure 16:
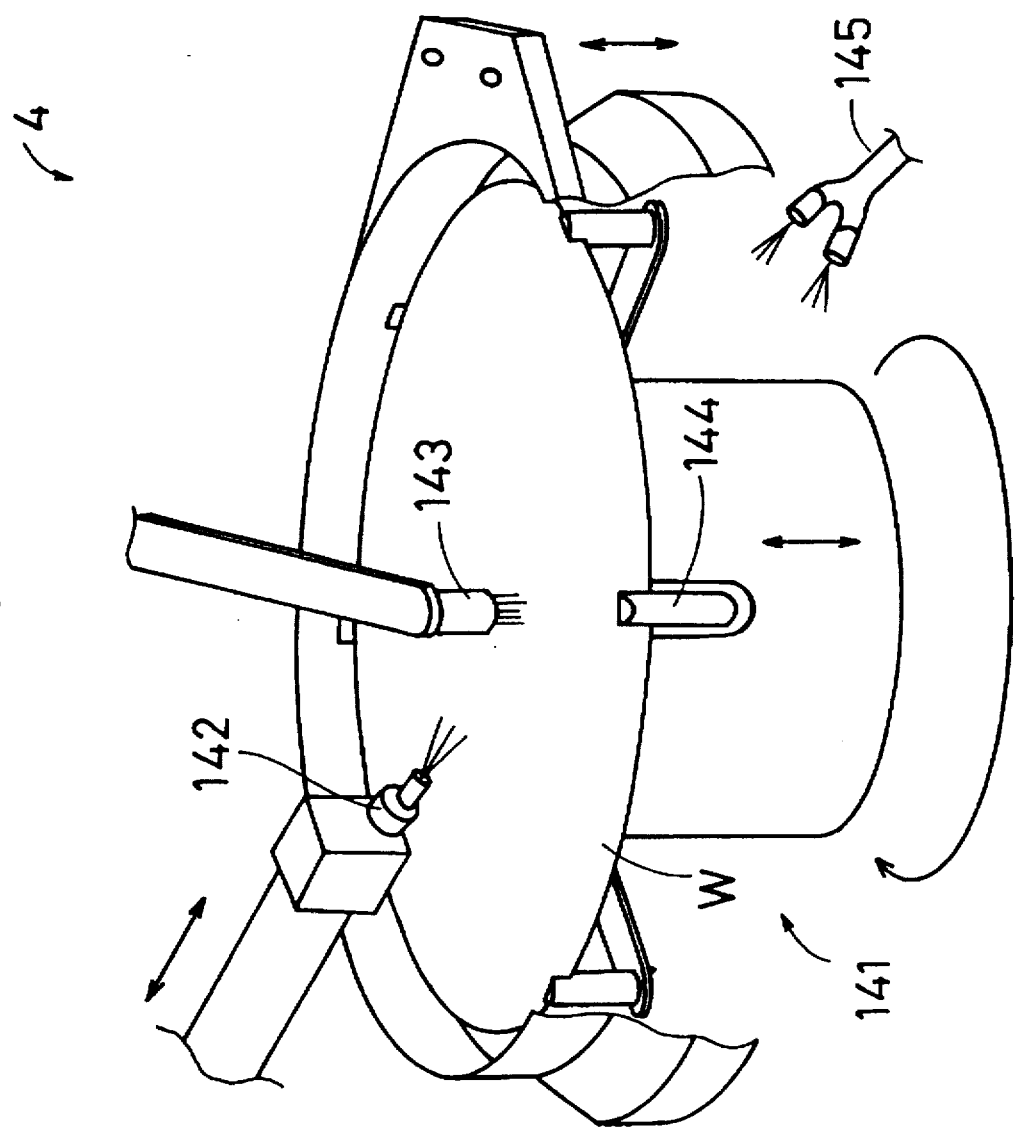
FIG. 16 is a perspective showing part of a rinsing and drying unit.

Referring to FIG. 16, the rinsing and drying unit 4 includes a wafer lifting and rotating mechanism 141 which is similar to that of the cleaning unit 3, a rinsing nozzle 142 capable of being protruded and withdrawn toward and from the surface of the wafer W in a radial direction, and a gas nozzle 143 for injecting nitrogen gas toward the center of the wafer W. The wafer lifting and rotating mechanism 141 includes a plurality of holding claws 144 for holding the side surface of the wafer W. While holding claws 144 hold the wafer W, deionized water is injected from the rinsing nozzle 142 to wash the wafer W while the wafer lifting and rotating mechanism 141 rotates the wafer W at low speed, and then, the wafer W is rotated at high speed to be drained and dried.

The cleaning and drying unit 4 also includes a nozzle 145 for removing particles coming from the upper or front surface to the lower or back surface. The rinsing nozzle 142 can be withdrawn when not used to prevent wafer W from being wetted at that time by drops of water from nozzle 142.

According to the substrate treatment apparatus of FIGS. 1–16, since deionized water is constantly supplied during transportation and treatment from the loader 1 to the cleaning and drying unit 4, the wafer W is prevented from being dried and from being in contact with air. Operations of the above substrate treatment apparatus will now be described.

When the cassette C housing a plurality of wafers W stacked face to face in the vertical direction is positioned at the cassette base 32 of the loader 1 by the positioning member 33, the lifting frame 10 is lowered to lower cassette C into the tank 11 whereby the wafer W in cassette C are soaked by liquid in tank 11. At this time, deionized water is supplied from the deionized water supplier 15 and overflows from the weir 14. As a result, a water current is formed from the opening 13 toward the rear side in the vicinity of the water surface of the tank 11. Therefore, when the lifting frame 19 is lowered, each wafer W receives force by the water current and the wafer W does not slip off the cassette C.

Figure 3:
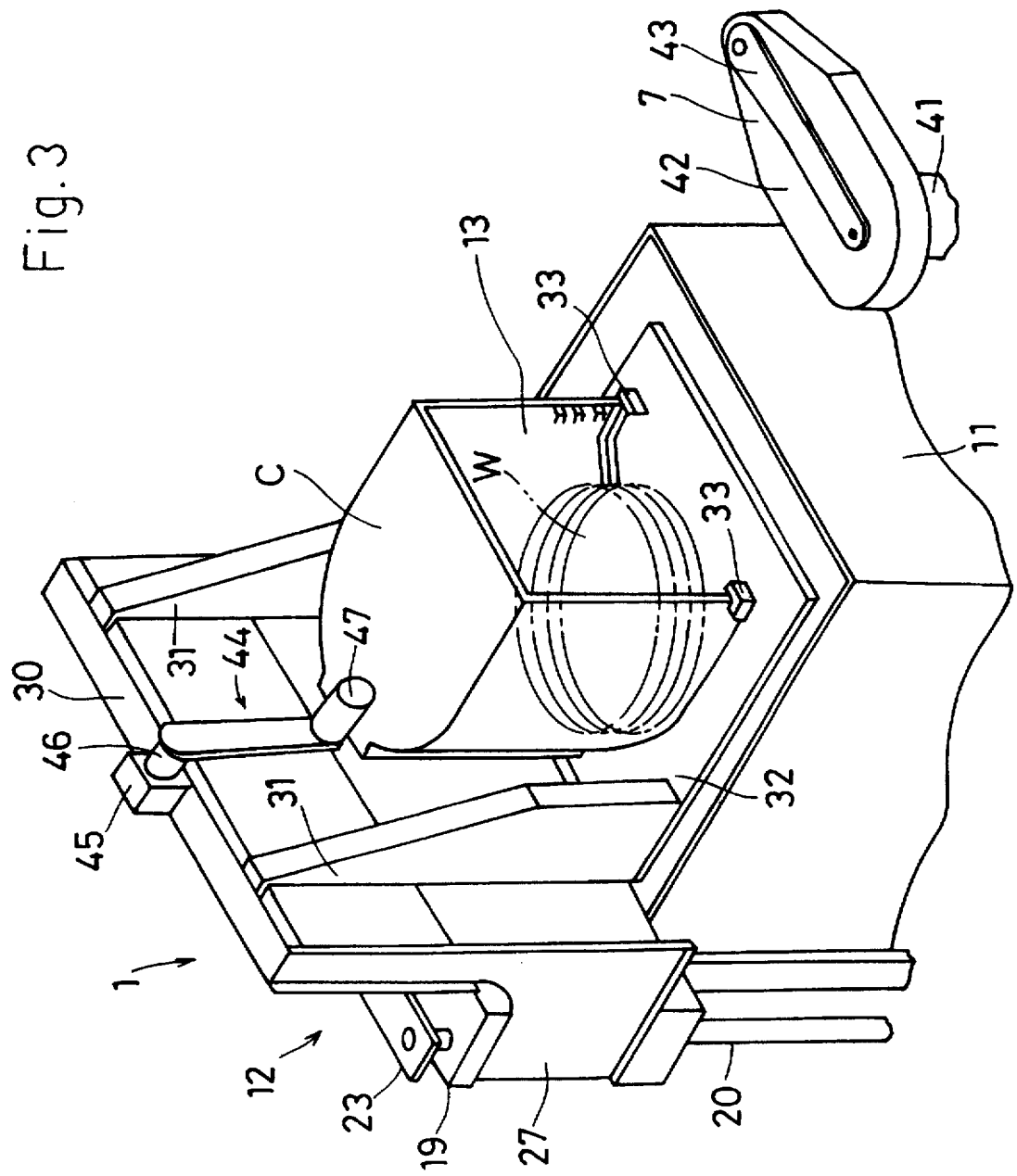
FIG. 3 is a perspective of part of a loader.

When the wafer W is being supplied to the cleaning unit 2, the soaked cassette C is lifted by the cassette lifting unit 12 (FIG. 3). The cassette lifting unit 12 is stopped in a position where the wafer W to be removed therefrom is a little higher than a position where the wafer is carried out. At this time, since water current is formed from the opening to the rear side in the vicinity of the liquid surface, the wafer W does not slip off the cassette C.

Figure 9:
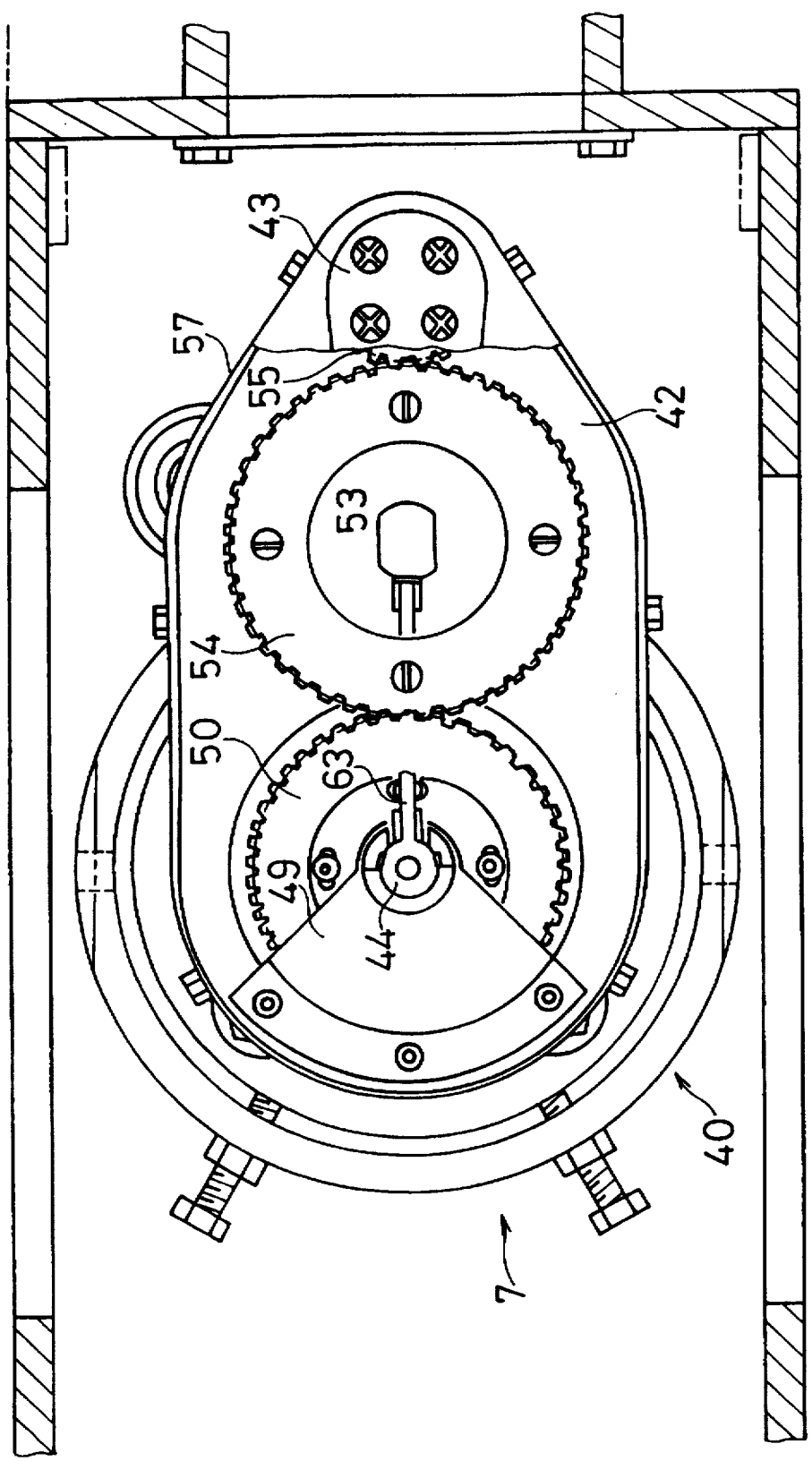
FIG. 9 is a partially sectioned plan view of the multi-joint robot.

Then, the rotation shaft 44 of the multi-joint robot 7 is rotated counterclockwise in FIG. 9 by a motor (not shown), and the base 42 is rotated counterclockwise through the rotation lever 49. Thus, the spur gear 50 fixed to the base 42 is rotated together with the base 42, and the pinion 55 is rotated through the middle gear 54. When the pinion 55 is rotated, the transport arm 58 is turned. Then, when the base 42 is rotated counterclockwise by 90°, the base 42 and the arm 43 are in the carrying-out position (shown by a two-dotted line in FIG. 6) in which they are aligned in a straight line. Then, the wafer W is received by the transport arm 43 of the multi-joint robot 7 when the cassette lifting unit 12 is lowered a little.

Then, pressure is made negative in the suction path 65 to adsorb and hold the wafer W. Additionally, the on-off valve 71 is opened in an instant to open the instrument conduit 68 to air. Thus, water in the instrument conduit 68 is discharged and the negative pressure can be confirmed by a vacuum system 69. Then, it is checked whether the lower limit point of the vacuum system 69 is turned on or not. Wherein the lower limit point is on, since the negative pressure is not sufficient, the unit is halted.

When it is detected that the negative pressure is normal and the wafer W is adsorbed normally, the rotation shaft 44 is rotated in the reverse direction (clockwise in FIG. 9) and the base 42 is rotated by 90° in the reverse direction. As a result, the transport arm 43 is in a waiting position where it is above the base 42. In this example, when the wafer W is received and taken out from the loader 1, the wafer W, the transport unit 6 and the cassette C are not in contact with each other. Therefore, particle generating by abrasion does not occur.

The multi-joint robot 7 is in the waiting position until a request for transportation from the cleaning unit 2 is made. During the waiting period, deionized water is injected from the nozzle 34. Therefore, the wafer W is not dried during transportation and waiting, thereby preventing oxidation, and adherence of airborne particulates, or agents generated by contact with air.

When the request for transportation is made by the cleaning unit 2, the rotation shaft 44 is further rotated clockwise by 90°. Then, the transport arm 43 is in a carrying-in position in which it is extended toward the cleaning unit 2 and the end thereof is disposed in the center of the cleaning unit 2. At this time, the air cylinders 96 and 97 advance in the cleaning unit 2 and the holding claws 85 and 86 hold the wafer W. The multi-joint robot 7 is returned to the waiting position.

Then, the wafer holding mechanism 80 is lowered by the motor 118 and the rotating circular brush 120 abuts the back surface of the wafer W. In this state, the wafer W is rocked by the motor 124 such that the rtm of the circular brush 120 is in contact with the rim of the wafer W. At this time, since deionized water is applied to the surface of the wafer W by the cleaning nozzle 82, the surface of the wafer W can be prevented from being dried and particles do not become attached thereto.

In this example, the wafer W cannot slip off the claws 85 and 86, become damaged, nor become encrusted with particulates. In addition, the back surface of the wafer W is completely exposed brush 120 so that the back surface of the wafer W can be cleaned. Furthermore, since the circular brush 120 and the claws 85 and 86 do not touch, life brush is extended.

Furthermore, since the diameter of the circular brush 120 is larger than the radius of the wafer W and smaller than the diameter thereof and the wafer W is rocked such that the rim of the circular brush 120 is in contact with the rim of the wafer W, particles are removed effectively and are not likely to be attached again. Furthermore, since deionized water discharged form the nozzle 127 flows toward the outer periphery of the wafer W by centrifugal force, the particles are effectively washed or flushed away and not likely to be attached again. In addition, the particles coming around from the back surface to the front surface are removed by the nozzle 82.

After the back surface of the wafer W is cleaned, the wafer holding mechanism 80 is lifted. Then, the multi-joint robot 7 disposed between the back surface cleaning unit 2 and the front surface cleaning unit 3 receives the wafer W and transports it to the unit 3. During the waiting period, deionized water is injected from the nozzle 34 to prevent the wafer W from being oxidized and dried.

In the cleaning unit 3, the wafer lifting and rotating mechanism 130 is lifted and the holding claw 133 holds the wafer W. Then, the wafer W is rotated and deionized water is injected from the ultrasonic nozzle 139 to impinge on the surface of the wafer W while the nozzle supporting arm 138 is rocked. At the same time, the arm 135 is rocked while the circular brush 136 is rotated to clean the surface of the wafer W.

At this time, the arm 135 is lowered in the vicinity of the center of the wafer W and the circular brush 136 abuts the surface of the wafer W. In this state, the arm 135 is moved in away from the center of the wafer W, and when the circular brush 136 reaches the outer periphery of wafer W, the arm 135 is lifted. The wafer W is washed by repeating this cycle.

While the wafer W is being cleaned, the back surface cleaning nozzle 145 directs deionized water to the back surface of the wafer W to remove particles that come from the front surface to the back surface. In addition, when the arm 135 is in a waiting position (shown by a two-dotted line in FIG. 15), deionized water is rejected from the cleaning nozzle 137 toward the rotating circular brush 136. Thus, particles attached to the circular brush 136 are removed.

In this example, the circular brush 136 is moved diametrically while the circular brush 136 abuts the center of the surface of the rotating wafer W. While the circular brush 136 moves and the wafer W is rotated, although particles are generated because the circular brush 136 rubs the wafer W, they are effectively discharged toward the outer periphery of the wafer W.

In addition, it is not necessary to simultaneously operate the circular brush 136 and the ultrasonic nozzle 139. If one of them is enough, they can be operated individually. Furthermore, since an injecting angle of the ultrasonic nozzle 139 can be adjusted, the particles are more effectively removed.

After the surface of the wafer W is cleansed, the multi-joint robot 7 disposed between the front surface cleaning unit 3 and the rinsing and drying unit 4 receives the wafer W and transports it to the rinsing and drying unit 4. During the waiting period, deionized water is also injected from the nozzle 34 to prevent the wafer W from being oxidized or dried.

In the rinsing and drying unit 4, the wafer lifting and rotating mechanism 141 is lifted and the holding claw 144 holds the wafer W. Then, the rinsing nozzle 142 advances and injects deionized water and the back surface cleaning nozzle 145 injects deionized water to the back surface. In this state, the wafer W is rotated. Then, injection of deionized water from the nozzles 142 and 145 is terminated and the rinsing operation is completed.

Then, the wafer W is rotated at high speed so that water attached to the front and back surfaces of the wafer W is scattered in the outer direction of the wafer W and the wafer W is drained and dried. Finally, nitrogen gas is injected from the gas nozzle 143 and water left in the center of the wafer W is removed. In addition, the nitrogen gas may be injected during the rotation of the wafer W. The gas is not only injected to the center of the wafer W but also may be directed against the whole surface of the wafer W.

After the wafer W is drained and dried, the multi-joint robot 7 disposed between the rinsing and drying unit 4 and the unloader 5 receives the wafer W and transports it to the unloader 5. In the unloader 5, the received wafer W is inserted into another cassette C for storage therein.

When all of the wafers W in the cassette C on the supplying side are treated and stored in the cassette C on the discharging side, the cassette C on the unloader 5 is discharged.

In this example, until reaching the rinsing and drying unit 4, the wafer W is always wet during transportation and treatment. Therefore, the wafer W is prevented from being dried and oxidation of the wafer W or fixing of particles to the wafer W caused by a contact with air can be prevented.

[Modifications]

(a) The present invention can be also applied to a substrate treatment apparatus which treats a glass plate for a liquid crystal or a photomask.

(b) Another cleaning liquid such as isopropyl alcohol may be used as treatment liquid instead of deionized water. In addition, chemical liquid for a given chemical treatment can be used in a treatment portion of the substrate to perform chemical treatment. The substrate surface-treating liquid may be selected from the group of $HCl/H_2O$, $HCl/H_2O_2/H_2O$, $HF/H_2O$, $HF/H_2O_2/H_2O$, $BHF/H_2O$, $NH_4F/H_2O$, $NH_4OH/H_2O$, $NH_4OH/H_2O_2/H_2O$, $H_2SO_4/H_2O_2/H_2O$, $HNO_3/H_2O$, and Organic Alkaline compounds such as choline and tetramethylammonium hydroxide. $HCl/H_2O$, $HCl/H_2O_2/H_2O$, $HF/H_2O$, $HF/H_2O_2/H_2O$, $BHF/H_2O$, $NH_4F/H_2O$, $H_2SO_4/H_2O_2/H_2O$, and $HNO_3/H_2O$ are effective to remove metallic impurities from the surface of a wafer W. $HF/H_2O$, $HF/H_2O_2/H_2O$, $BHF/H_2O$, $NH_4F/H_2O$, $NH_4OH/H_2O$, $NH_4OH/H_2O_2/H_2O$, $H_2SO_4/H_2O_2/H_2O$, $HNO_3/H_2O$, and Organic Alkaline compounds such as choline and tetramethylammonium hydroxide are effective to remove particles from the surface of the wafer W.

(c) The circular brush may be rocked instead of the wafer holding mechanism, or both of them may be rocked.

(d) A configuration of the holding claw may be any configuration if it includes a surface abutting on a rim of the wafer W and a convex portion for controlling upward movement of the wafer W, the lower surface of the wafer W can abut on the whole surface of the circular brush, and the wafer can be held.

Figure 17:
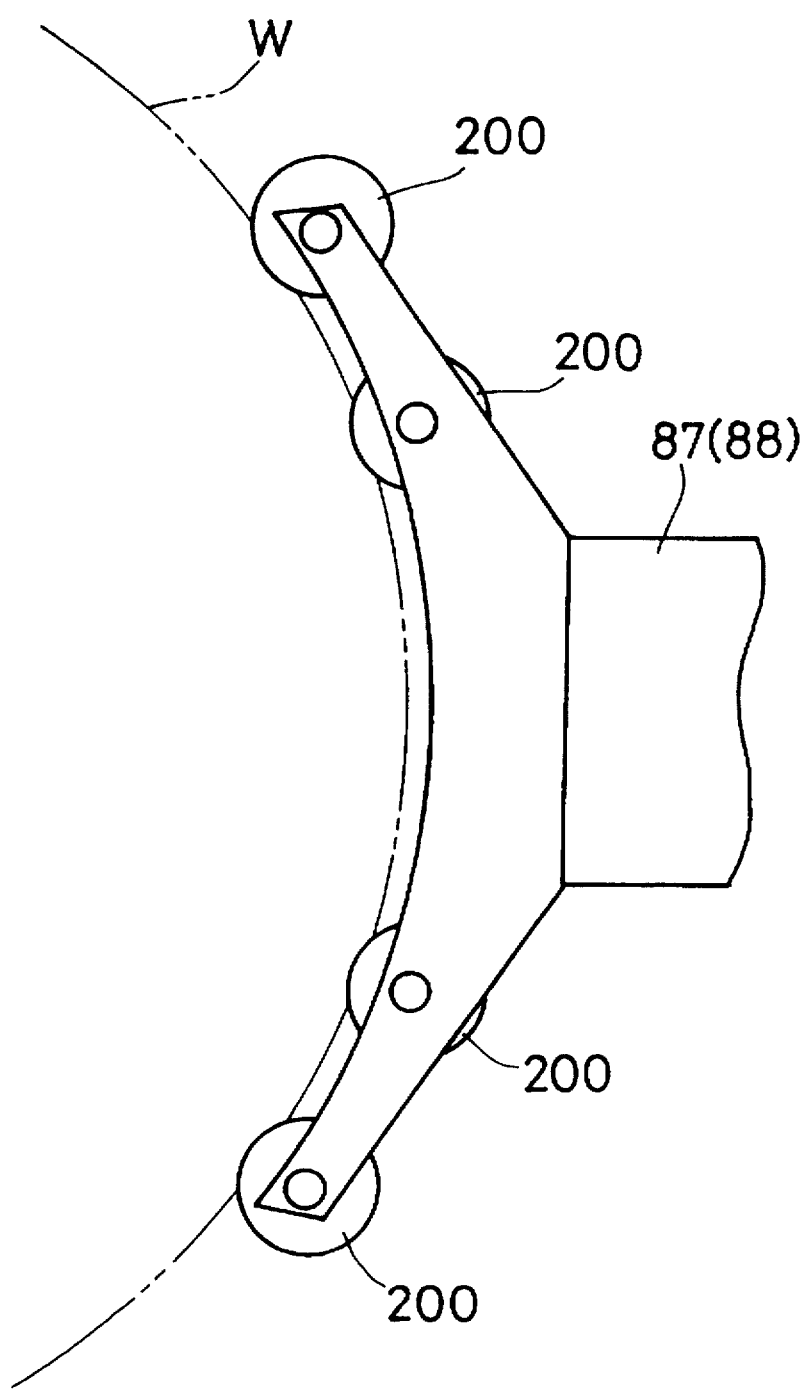
FIG. 17 is a plan view showing part of a modified back surface cleaning unit.
Figure 18:
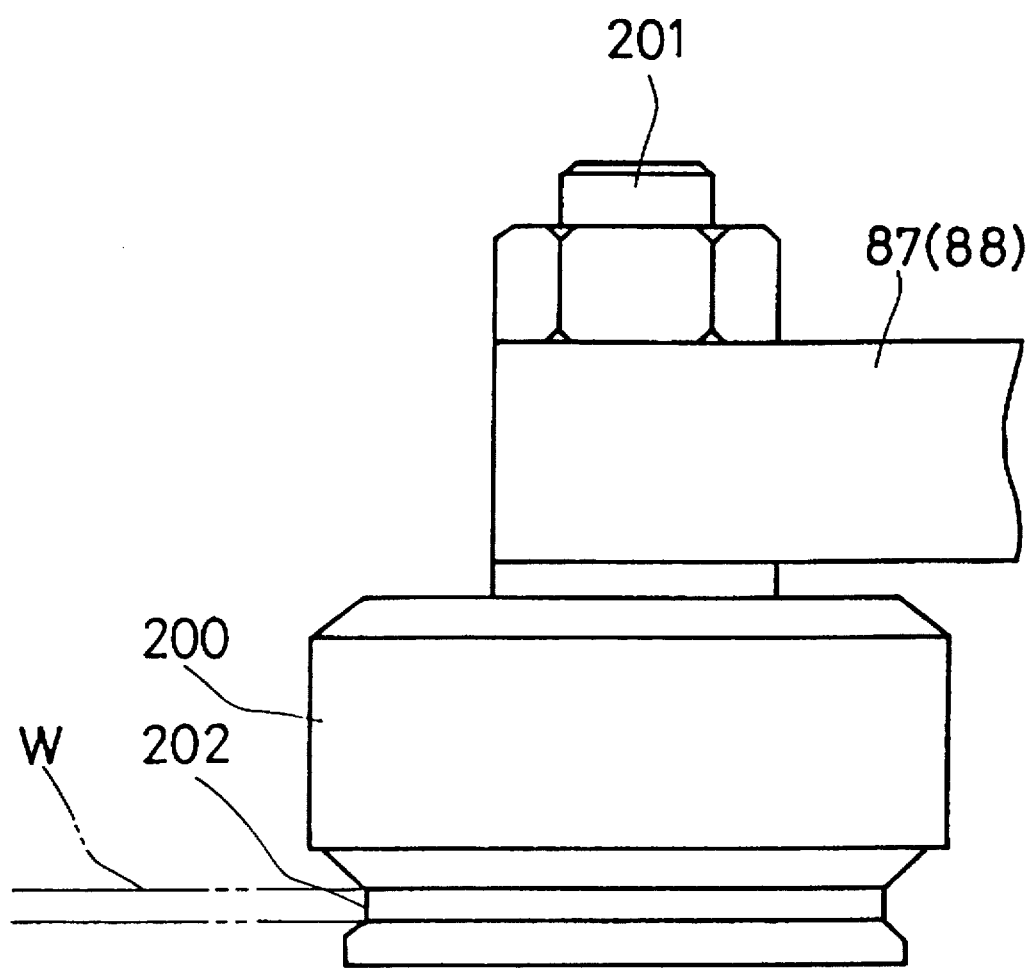
FIG. 18 is a side view from a roller of the modified unit of FIG. 17.

(e) Holding claws shown in FIGS. 17 and 18 may be used. The holding claws have a plurality of rollers 200 each of which is rotatably retained by the holding arm 87 (or 88) through a vertical rod 201. Each roller 200 has a circumferential groove on the cylindrical surface to act as a claw that receives the wafer W.

Since the wafer W can be rotated to a slight extent by the rotation of the circler brush 120, the entire peripheral edge of the wafer can be cleaned.

(f) In the structure of FIGS. 11 and 12 or of FIGS. 17 and 18, the clawing action of the holding bracket 91 by the air cylinder 96 may be intermittently inactivated by a controller to allow the wafer W to rotate a little. This control facilitates cleaning of the entire peripheral edge of the wafer W.

(g) A nozzle or a slit for injecting deionized water, instead of the deionized water supplier 15, can be provided in the vicinity of the liquid surface at the side wall of the tank 11 facing the cassette opening 13, to form a water current from the opening 13 to the rear side. The deionized water supplier 15 itself is provided in the side wall of the tank 11 to form the water current. In addition, a compulsory drainage hole (not shown) may be provided in the side surface on the weir 14 side instead of the weir 14 in order to form the water current.

Various details of this invention may be changed without departing from its spirit or its scope. Furthermore, the foregoing description of the embodiments according to the present invention is provided for the purpose of illustration only, and not for the purpose of limiting the invention as defined by the appended claims and their equivalents.

What is claimed is:

1. A substrate-treating apparatus for treating opposite surfaces of each of a plurality of substrate plates in a process of preparing the plates for industrial use, wherein the plates are retrievable from a substrate storage where the substrate plates are disposed in a vertical stack, the substrate-treating apparatus comprising:

a substrate soaking section for soaking said substrate storage in a substrate surface-treating liquid;

a first substrate-treating section for carrying out a first substrate-treating process applying surface-treating liquid onto a substrate retrieved from said substrate storage;

a first substrate-transporting section disposed between said substrate soaking section and said first substrate-treating section, including first surface-treating liquid applying means for applying surface-treating liquid to said substrate;

said substrate storage comprising a housing having a lateral opening as a passage for retrieval of said substrate plates from said vertical stack; and said substrate soaking section comprises:

a tank for soaking said substrate storage, containing said substrate surface-treating liquid;

storage lifting means for vertically moving said substrate storage when soaking in said tank; and current flowing means for forming a current at least superficially in the substrate surface-treating liquid in said tank, said current flowing from said lateral opening of the substrate storage housing in a rearward direction of said substrate soaking section.

2. A substrate-treating apparatus according to claim 1, wherein said current flowing means includes a weir on said tank, said weir being adjustable in height.

3. A substrate-treating apparatus for treating opposite surfaces of each of a plurality of substrate plates in a process of preparing the plates for industrial use, wherein the plates are retrievable from a substrate storage where the substrate plates are disposed in a vertical stack, the substrate-treating apparatus comprising:

a substrate soaking section for soaking said substrate storage in a substrate surface-treating liquid;

a first substrate-treating section for carrying out a first substrate-treating process applying surface-treating liquid onto a substrate retrieved from said substrate storage;

a first substrate-transporting section disposed between said substrate soaking section and said first substrate-treating section, including first surface-treating liquid applying means for applying surface-treating liquid to said substrate;

said substrate soaking section comprising a tank for soaking said substrate storage, said tank containing said substrate surface-treating liquid; and storage lifting means for vertically moving said substrate storage when soaking in said tank;

said first substrate transporting section comprises substrate retrieval means having a multi-joint structure, for retrieving an individual substrate from said vertical stack in said substrate storage by entering said substrate storage, supporting a substrate from underneath, and subsequently withdrawing the substrate from said substrate storage; and said liquid applying means for applying liquid to said substrate plates preventing said substrate plates from drying during transport by said first substrate-transporting section.

4. A substrate-treating apparatus according to claim 3, wherein said first substrate-transporting section further comprises:

a suction passage;

negative pressure generating means communicating with said suction passage to generate negative pressure in said suction passage for adsorbing said substrate;

negative pressure gauging means for gauging negative pressure as generated by said negative pressure generating means; and liquid evacuating means for evacuating substrate surface-treating liquid drawn into said negative pressure gauging means via said suction passage and remaining between said negative pressure generating means and said negative pressure gauging means.

5. A substrate-treating apparatus according to claim 3, wherein said liquid supplying means includes a spray nozzle for spraying deionized water on said substrate plates.

6. A substrate-treating apparatus according to claim 5, wherein said substrate is circular, and said spray nozzle injects deionized water in the form of a cone having a diameter larger than that of said substrate.

7. A substrate-treating apparatus for treating opposite surfaces of each of a plurality of substrate plates in a process of preparing the plates for industrial use, wherein the plates are retrievable from a substrate storage where the substrate plates are disposed in a vertical stack, the substrate-treating apparatus comprising:

a substrate soaking section for soaking said substrate storage in a substrate surface-treating liquid;

a first substrate-treating section for carrying out a first substrate-treating process applying surface-treating liquid onto a substrate retrieved from said substrate storage;

a first substrate-transporting section disposed between said substrate soaking section and said first substrate-treating section, including first surface-treating liquid applying means for applying surface-treating liquid to said substrate;

a second substrate-treating section for carrying out a second substrate-treating process of applying surface-treating liquid onto a substrate retrieved from said first substrate-treating process in said first substrate-treating section; and a second substrate-transporting section disposed between the first and second substrate-treating sections, including second surface-treating liquid applying means for applying surface-treating liquid to said substrate retrieved from said first substrate-treating process.

8. A substrate-treating apparatus according to claim 7, wherein said first substrate-treating section is for cleaning a reverse surface of said substrate; and said second substrate-treating section is for cleaning an obverse surface of said substrate, said obverse surface being opposite said reverse surface from a position superior to said substrate, the reverse surface thereof having been cleaned in said first substrate-treating section.

9. A substrate-treating apparatus according to claim 8, wherein said substrate is circular, and said first substrate-treating section comprises:

substrate holding means, including laterally opposed clamps beveling radially inward with respect to said substrate, over the obverse surface thereof, for circumferentially abutting said substrate, wherein said substrate is retained rimwise such that the reverse surface thereof is exposed unobstructed; and a circular brush for cleaning the reverse surface of said substrate as held by said substrate holding means.

10. A substrate-treating apparatus according to claim 9, wherein each of said clamps includes an abutment surface at the lower portion of said clamp forming a part of the same cylindrical surface to hold said substrate.

11. A substrate-treating apparatus according to claim 9, wherein said circular brush has a deionized water supplying nozzle in the center of said brush.

12. A substrate-treating apparatus according to claim 8, wherein said substrate is circular, and said first substrate-treating section comprises:

a plurality of rollers for holdingly engaging the peripheral edge of said substrate;

a retainer for rotatably retaining said rollers; and a circular brush for cleaning the reverse surface of said substrate as held by said substrate holding means.

13. A substrate-treating apparatus according to claim 12, wherein said circular brush has a deionized water supplying nozzle at its center.

14. A substrate-treating apparatus according to claim 7, wherein said substrate is circular, and said first substrate-treating section comprises:

substrate holding means for holding said substrate in a lateral position;

a circular brush mounted to a rotation shaft turning on an axis intersecting the obverse and reverse surfaces of said substrate, said circular brush abuttable with the reverse surface of the substrate as held by said substrate holding means;

rotating means for rotating said substrate and said circular brush relatively to each other; and rocking means for laterally rocking said substrate and said circular brush relative to each other in rocking strokes.

15. A substrate-treating apparatus according to claim 8, wherein said substrate is circular, and said second substrate-treating section comprises:

substrate holding means for holding said substrate;

a rotation arm turning on an axis intersecting the opposite surfaces of said substrate;

a circular brush mounted to said rotation arm, said circular brush abuttable with the obverse surface of the substrate as held by said substrate holding means, and having a central liquid outlet for discharging surface-treating liquid;

rotating means for rotating said substrate and said circular brush relatively to each other; and liquid flowing means for flowing surface-treating liquid that is emitted from said central liquid outlet.

16. A substrate-treating apparatus according to claim 15, wherein said rotation arm rotates such that said circular brush moves along the obverse surface toward the outer periphery from the center of said substrate.

17. A substrate-treating apparatus according to claim 16, wherein said rotating means rotates said substrate and said circular brush such that said substrate holding means rotates said substrate about the center of said substrate, and said circular brush rotates about the center of said brush.

18. A substrate-treating apparatus for treating substrate plates in preparation for industrial use, comprising:

a substrate storage wherein substrate plates are stored prior to treating same;

substrate soaking means for soaking said substrate storage in a substrate surface-treating liquid;

substrate treating means for treating the substrate plates in a process that includes flushing the plates with surface-treating liquid;

substrate transporting means for transporting said substrate plates from said substrate storage to said substrate treating means, said substrate transporting means being constructed of liquid repellent materials; and liquid supplying means connected to said substrate transporting means for supplying liquid to said substrate plates to prevent said substrate plates from drying during transport by said substrate transporting means.

19. A substrate-treating apparatus according to claim 18, further comprising:

a suction passage provided for conducting negative pressure adhering the substrate to said liquid-repellent substrate transporting means supporting said substrate;

negative pressure generating means communicating with said suction passage for generating negative pressure in said suction passage;

negative pressure gauging means for gauging negative pressure as generated by said negative pressure generating means; and liquid evacuating means for evacuating substrate surface-treating liquid drawn into said negative pressure gauging means via said suction passage and remaining between said negative pressure generating means and said negative pressure gauging means.

20. A substrate-treating apparatus according to claim 19, wherein said liquid supplying means includes a spray nozzle for spraying deionized water at said substrate plates.

21. A substrate-treating apparatus according to claim 20, wherein said substrate is circular, and said spray nozzle injects deionized water in the form of a cone having a diameter larger in said substrate.

22. A substrate-treating apparatus according to claim 21, wherein said substrate transporting means includes a transport arm extending horizontally, and said suction passage opens at one end of said arm.

* * * * *